(12) United States Patent
Kim et al.

(10) Patent No.: US 12,057,331 B2
(45) Date of Patent: Aug. 6, 2024

(54) HIGH DENSITY PICK AND SEQUENTIAL PLACE TRANSFER PROCESS AND TOOL

(71) Applicant: Apple Inc., Cupertino, CA (US)

(72) Inventors: Hyeun-Su Kim, Mountain View, CA (US); Dariusz Golda, Portola Valley, CA (US); Chae Hyuck Ahn, Campbell, CA (US); Kevin T. Huang, Atherton (CA); Eric B. Newton, Albany, CA (US)

(73) Assignee: Apple Inc., Cupertino, CA (US)

( * ) Notice: Subject to any disclaimer, the term of this patent is extended or adjusted under 35 U.S.C. 154(b) by 346 days.

(21) Appl. No.: 17/345,258

(22) Filed: Jun. 11, 2021

(65) Prior Publication Data
US 2022/0013380 A1    Jan. 13, 2022

Related U.S. Application Data

(60) Provisional application No. 63/051,126, filed on Jul. 13, 2020, provisional application No. 63/051,125, filed on Jul. 13, 2020.

(51) Int. Cl.
| | | |
|---|---|---|
| H01L 21/00 | (2006.01) |
| B65G 47/90 | (2006.01) |
| H01L 21/67 | (2006.01) |
| H01L 25/075 | (2006.01) |
| H01L 33/62 | (2010.01) |
| B41F 16/00 | (2006.01) |

(52) U.S. Cl.
CPC ........ *H01L 21/67144* (2013.01); *B65G 47/90* (2013.01); *H01L 25/0753* (2013.01); *H01L 33/62* (2013.01); *B41F 16/00* (2013.01); *H01L 2933/0066* (2013.01)

(58) Field of Classification Search
CPC .......... H01L 21/67144; H01L 25/0753; H01L 33/62; B65G 47/90
See application file for complete search history.

(56) References Cited

U.S. PATENT DOCUMENTS

| | | |
|---|---|---|
| 3,916,203 A | 10/1975 | Norgren |
| 6,863,109 B2 | 3/2005 | Kim et al. |

(Continued)

FOREIGN PATENT DOCUMENTS

| | | |
|---|---|---|
| KR | 20080022481 A | 3/2008 |
| WO | 2014039335 A1 | 3/2014 |
| WO | 2016160322 A1 | 10/2016 |

OTHER PUBLICATIONS

PCT/US2021/056228, "PCT Notification of Transmittal of the International Search Report and the Written Opinion of the International Searching Authority, or the Declaration", mailed Jul. 18, 2022, 15 pages.

(Continued)

*Primary Examiner* — Victor A Mandala
*Assistant Examiner* — Colleen E Snow
(74) *Attorney, Agent, or Firm* — Aikin & Gallant, LLP

(57) ABSTRACT

Mass transfer tools and methods for high density transfer of arrays of micro devices are described. In an embodiment, a mass transfer tool includes a micro pick up array with an array of transfer heads arranged in clusters. The clusters of transfer heads can be used to pick up a high density group of micro devices followed by sequential placement onto a receiving substrate.

28 Claims, 27 Drawing Sheets

(56) References Cited

U.S. PATENT DOCUMENTS

| | | |
|---|---|---|
| 7,012,684 B1 | 3/2006 | Hunter |
| 8,415,767 B1 | 4/2013 | Golda et al. |
| 8,415,768 B1 | 4/2013 | Golda et al. |
| 8,415,771 B1 | 4/2013 | Golda et al. |
| 10,438,339 B1 | 10/2019 | Czarnota et al. |
| 2014/0064904 A1* | 3/2014 | Bibl ............... B81C 99/002 216/13 |
| 2014/0071580 A1 | 3/2014 | Higginson et al. |
| 2014/0158415 A1 | 6/2014 | Golda et al. |
| 2016/0094160 A1 | 3/2016 | Golda et al. |
| 2016/0094161 A1* | 3/2016 | Bathurst ............. B81C 99/002 361/234 |
| 2017/0140961 A1 | 5/2017 | Sasaki et al. |
| 2018/0076076 A1 | 3/2018 | Bathurst et al. |
| 2020/0243358 A1 | 7/2020 | Kwag et al. |

OTHER PUBLICATIONS

PCT/US2021/056228, "PCT Invitation to Pay Additional Fees and, Where Applicable, Protest Fee", mailed May 25, 2022, 11 Pages.

* cited by examiner

HIGH DENSITY PICK AND SEQUENTIAL PLACE TRANSFER PROCESS AND TOOL

RELATED APPLICATIONS

This application claims the benefit of priority of U.S. Provisional Application No. 63/051,126 filed Jul. 13, 2020 and U.S. Provisional Application No. 63/051,125 filed Jul. 13, 2020 each of which is hereby incorporated by reference.

BACKGROUND

Field

Embodiments described herein relate to systems and methods for transferring micro devices.

Background Information

Integration and packaging issues are one of the main obstacles for the commercialization of micro devices such as radio frequency (RF) microelectromechanical systems (MEMS) microswitches, light-emitting diodes (LEDs), and MEMS or quartz-based oscillators.

Traditional technologies for transferring of devices such as "direct printing" and "transfer printing" include transfer by wafer bonding from a transfer wafer to a receiving wafer. In both traditional and variations of the direct printing and transfer printing technologies, the transfer wafer is de-bonded from a device after bonding the device to the receiving wafer. In addition, the entire transfer wafer with the array of devices is involved in the transfer process.

In one process variation a transfer tool including an array of electrostatic transfer heads is used to pick up and transfer an array of micro devices from a carrier (donor) substrate to a receiving substrate. In such an implementation, the transfer heads operate in accordance with principles of electrostatic grippers, using the attraction of opposite charges to pick up the micro devices.

In a particular implementation it has been suggested to use an array of electrostatic transfer heads to populate a display backplane with an array of micro LED devices, in which sequential pick and place transfer operations are performed to populate the display backplane with a plurality of different color-emitting micro LEDs from different donor substrates.

SUMMARY

Mass transfer tools and methods for high density transfer of arrays of micro devices are described. In accordance with embodiments a mass transfer tool (MTT) can include one or more articulating transfer head assemblies which carry a corresponding micro pick up array (MPA) to transfer an array of micro devices between a donor substrate and receiving substrate. The MPAs may include an array of transfer heads, which may be arranged into a plurality of clusters.

In an embodiment, an MPA includes an array of transfer heads arranged in a plurality of clusters, with each cluster including a corresponding plurality of transfer heads. The clusters may optionally include rows of transfer heads. In an embodiment, adjacent transfer heads (e.g. within a row or column of transfer heads) within a cluster are separated by an intra-cluster spacing (Sh), and adjacent clusters (e.g. within a row or column of clusters) are separated by an inter-cluster spacing (Sc) that is greater than the intra-cluster spacing (Sh). The transfer heads can be designed for different modes of operation such as elastomeric contact surfaces for pick and place, vacuum, or operate in accordance with electrostatic principles. In an exemplary implementation each transfer head is an electrostatic transfer head. In an embodiment, each transfer head includes an elastomeric contact surface.

A variety of transfer head arrangements that may facilitate high density pick and place transfer process, as well as cluster arrangements. In an embodiment, an MPA includes a base substrate, and an array of polycrystalline compliant transfer heads on the base substrate. For example, the polycrystalline compliant transfer heads may be fabricated using an epitaxial growth and patterning in a layer-by-layer processing sequence to facilitate a vertically integrated spring structure.

In an embodiment an MPA includes a base substrate, an array of transfer heads over the base substrate, where each transfer head including a mesa structure. An electrically conductive layer may partially cover the mesa structure for each transfer head in the array of transfer heads to form an electrostatic shield. A first voltage source contact may be coupled with the electrically conductive layer, for example for grounding, and a second voltage source contact may be coupled with the array of mesa structures of the array of transfer heads, for example to provide an operating voltage to the array of transfer heads. Such a configuration with an electrostatic shield may be integrated with a monopolar transfer head configuration to facilitate further densification of the transfer heads and ability to hold the micro devices at a fixed potential and to shield the micro device from stray electric fields.

In an embodiment an MPA includes a base substrate and a base spring layer over the base substrate. The base spring layer may include a plurality of spring arms and a spring platform. An encapsulation membrane layer spans over the base spring layer, and a mesa structure protrude from the spring platform and through a corresponding opening in the encapsulation membrane layer such that the mesa structure is deflectable through the corresponding opening and toward the base substrate. In such a configuration the encapsulation membrane layer can function as an electrostatic shield may be integrated with a monopolar transfer head configuration to facilitate further densification of the transfer heads and ability to hold the micro devices at a fixed potential and to shield the micro device from stray electric fields. The transfer heads of such an MPA can also be polycrystalline compliant transfer heads fabricated using epitaxial growth and patterning in a layer-by-layer processing sequence.

In an embodiment, the MPA further includes a plurality of submesa interconnects, where each row of transfer heads spans over a pair of submesa interconnects, with each first mesa structure protruding from a first submesa interconnect and each second mesa structure protruding from a second submesa interconnect. The first and second submesa interconnects may be connected to different voltage sources to provide the bi-polar electrostatic gripping force. The transfer heads may also be monopolar or different multi-polar arrangements.

In an embodiment a transfer process includes picking up a first group of LEDs from a first donor substrate with an MPA including a plurality of clusters of transfer heads, positioning the MPA over a first location of a display substrate, placing a first LED of the first group of LEDs from each cluster onto the display substrate, positioning the MPA over a second location of the display substrate, and placing a second LED of the first group of LEDs from each cluster onto the display substrate.

In an embodiment, a transfer process includes picking up a first group of LEDs from a first donor substrate with a first articulating transfer head assembly, picking up a second group of LEDs from the first donor substrate with a second articulating transfer head assembly, translating the first and second articulating transfer head assemblies toward a display substrate, positioning the first articulating transfer head assembly over the display substrate, placing a first group of LEDs onto the display substrate, positioning the second articulating transfer head assembly over the display substrate, and placing the second group of LEDs onto the display substrate.

DETAILED DESCRIPTION

Figure 1:
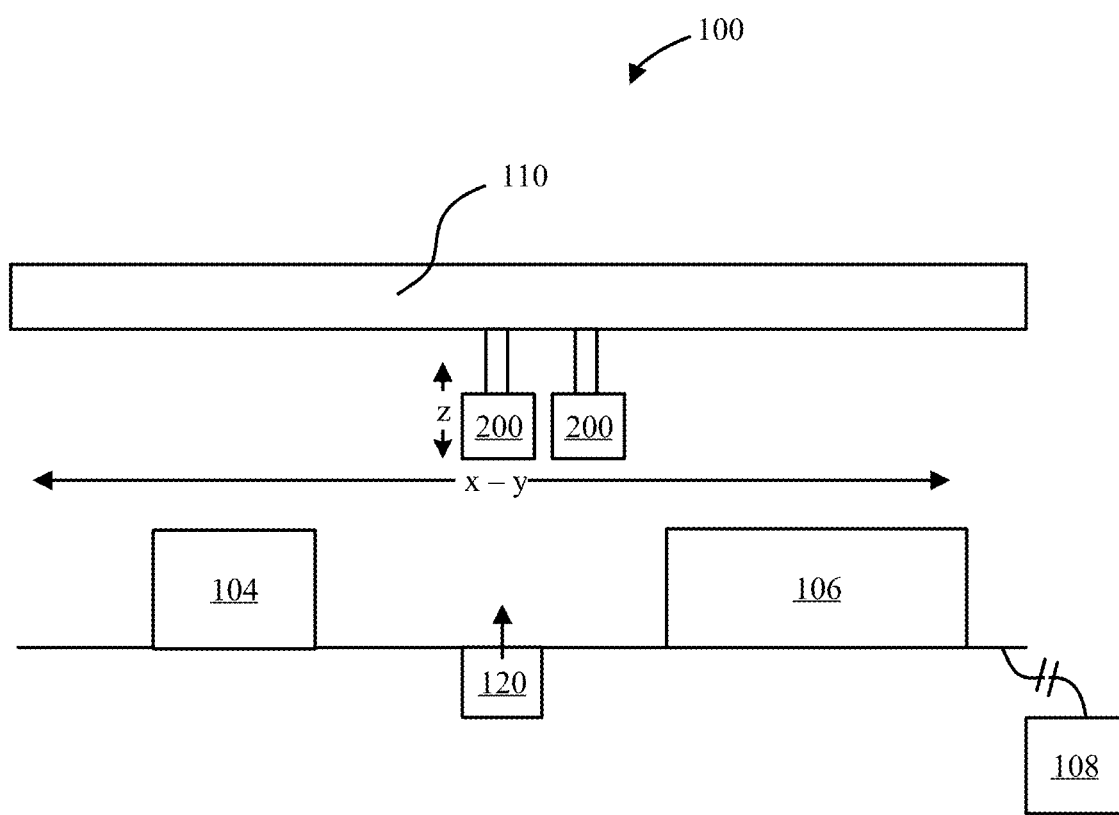
FIG. 1 is a schematic illustration of a mass transfer tool assembly in accordance with an embodiment.

Embodiments describe systems and methods for high density transfer of arrays of micro devices from a donor substrate to a receiving substrate. For example, the arrays of micro devices may be micro LEDs. While some embodiments are described with specific regard to micro LEDs, the embodiments of the invention are not so limited and certain embodiments may also be applicable to other micro devices such as diodes, transistors, integrated circuit (IC) chips, MEMS, and bio-samples.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

The terms "micro" device or "micro" LED as used herein may refer to the descriptive size of certain devices or structures in accordance with embodiments. As used herein, the term "micro" is meant to refer to the scale of 1 to 300 µm. For example, each micro device may have a maximum length or width of 1 to 300 µm, 1 to 100 µm, or less. In some embodiments, the micro LEDs may have a maximum length and width of 20 µm, 10 µm, or 5 µm. However, it is to be appreciated that embodiments of the present invention are not necessarily so limited, and that certain aspects of the embodiments may be applicable to larger, and possibly smaller size scales.

In accordance with embodiments, a mass transfer tool (MTT) and method of operation are described that enable picking up a high density of micro devices from a donor substrate and sequentially placing groups of the micro devices onto one or more receiving substrates. In an embodiment, the MTT includes an articulating transfer head assembly that carries a micro pick up array (MPA) that, depending upon size of the MPA and specifications for the receiving substrate, may include thousands of individual transfer heads.

In an embodiment, an MPA includes an array of transfer heads arranged in a plurality of clusters, with each cluster including a corresponding plurality of transfer heads. In an exemplary implementation the transfer heads may be arranged in rows, and columns within a cluster. Adjacent transfer heads within a row of transfer heads within a cluster are separated by an intra-cluster spacing, and adjacent clusters within a row of clusters are separated by an inter-cluster spacing that is greater than the intra-cluster spacing.

In an embodiment, a transfer sequence includes picking up a first group of LEDs from a first donor substrate with an MPA including a plurality of clusters of transfer heads, positioning the MPA over a first location of a display substrate, placing a first LED of the first group of LEDs from each cluster onto the display substrate, positioning the MPA over a second location of the display substrate, and then placing a second LED of the first group of LEDs from each cluster onto the display substrate. This sequence can continue until all LEDs of the first group of LEDs are placed onto the display substrate. The sequence than then be repeated for a second group of LEDs from the same donor substrate (e.g. same color-emitting LEDs) or different donor substrate (e.g. different color-emitting LEDs, or same color-emitting LEDs to reduce donor associated defects).

In one aspect, the cluster pick and sequential place sequences, and MPAs fabricated to include such clusters of transfer heads, can provide a higher pick density compared to a transfer sequence in which every LED that is picked is then simultaneously placed. Furthermore, the sequential place operations can cover less distance, and resultingly time required for placement. Thus, overall throughput can be increased for the display assembly process and cost can be reduced.

A variety of MPA configurations can be used to perform the high density cluster pick and sequential place sequences. In some embodiments, the transfer heads are compliant transfer heads that are deflectable upon contact with a corresponding micro device (e.g. LED) or target substrate. This compliance can compensate for misalignment of the articulating transfer head assembly/MPA and target substrate, as well as for variations in height and contamination. Such compensation can result in reduced compressive forces applied to certain micro devices, leading to protection of the physical integrity of the micro devices and transfer head array. Furthermore, such compensation can facilitate application of uniform, or sufficient grip pressure with the transfer heads when operating in accordance with electrostatic principles.

In accordance with embodiments, dimensions of the clusters of transfer heads (and micro devices picked by the transfer heads), as well as the receiving substrate (e.g. display substrate) are designed so that a topography tolerance exists on the receiving substrate to receive all of the micro devices held by the transfer heads, including those not being placed. In an exemplary display panel fabrication sequence, this may include a display substrate topography being designed to accommodate the clusters of transfer heads, and corresponding clusters of LEDs held by the transfer heads, during the sequential placement of each LED from each cluster until all LEDs from the cluster have been placed onto the display substrate. In an embodiment, adjacent transfer heads within a row of transfer heads in a cluster are separated by an intra-cluster spacing, and adjacent clusters within a row of clusters (along same axis, or parallel with the row of transfer heads) are separated by an inter-cluster spacing that is greater than the intra-cluster spacing. Thus, the clusters are spaced out further than the transfer heads within the clusters. In order to accommodate the clusters of transfer heads, and LEDs held by the transfer heads, a cluster width of transfer heads within a cluster can fit within an inter-subpixel pitch between immediately adjacent first arrays of subpixels (e.g. first color-emitting subpixels) and second arrays of subpixels (e.g. second color-emitting subpixels). Consequently, the inter-cluster spacing will be greater than the inter-subpixel pitch. Such arrangements may negate the possibility of an LED already placed in a subpixel from interfering with subsequent placement of other color-emitting LEDs into another subpixel within the same pixel (or adjacent pixel), even when the other color-emitting LED is part of a cluster of other color-emitting LEDs held by an MPA.

The display substrate in accordance with embodiments may be designed to accommodate a high density of pixels, or pixels per inch (PPI). Consequently, increased PPI may correlate to a reduced (e.g. first-second) subpixel array spacing. In accordance with embodiments, each transfer head may be independently deflectable. For example, each transfer head may be supported by corresponding spring platform that is deflectable toward/into a cavity. Alternatively, a plurality of transfer heads (e.g. cluster) can be supported by a same spring platform. Consolidating multiple transfer heads onto a shared spring platform can reduce space required for multiple spring components and increase density.

In accordance with some embodiments, the transfer heads can be designed for different modes of operation. For example, the transfer heads can include elastomeric contact surfaces for pick and place, include vacuum holes, or operate in accordance with electrostatic principles in order to generate higher gripping pressure and reduced size. The transfer heads can include mesa structures to provide localized contact points for the transfer heads. The electrostatic transfer heads may be monopolar, or multi-polar (e.g. bipolar, etc.). For example, multi-polar transfer heads may be utilized to mitigate against residual charge buildup or provide a charge differential where the target substrate (e.g. donor, receiving, display) is not maintained at a reference voltage. In one aspect, multi-polar transfer heads can include mesa structures extending from common submesa interconnects coupled to a same voltage source. Such an arrangement may facilitate further densification of the electrostatic transfer heads.

In another aspect, multiple articulating transfer head assemblies and corresponding MPAs can be utilized to increase transfer throughput and reduce assembly process cost. In an embodiment, a transfer sequence includes picking up a first group of LEDs from a first donor substrate with a first articulating transfer head assembly, picking up a second group of LEDs from the first donor substrate with a second articulating transfer head assembly, translating the first and second articulating transfer head assemblies (e.g. along a translation track) toward a display substrate, positioning the first articulating transfer head assembly over the display substrate, placing a first group of LEDs onto the display substrate, positioning the second articulating transfer head assembly over the display substrate, and placing the second group of LEDs onto the display substrate.

FIG. 1 is a schematic illustration of a mass transfer tool in accordance with an embodiment. Mass transfer tool 100 may include one or more articulating transfer head assemblies 200, each for picking up an array of micro devices from a carrier (donor) substrate held by a carrier substrate stage 104 and for transferring and releasing the array of micro devices onto a receiving substrate held by a receiving substrate stage 106. In an embodiment, an upward facing inspection camera 120 is located between the carrier substrate stage 104 and the receiving substrate stage 106. In this manner, the underside of an articulating transfer head assembly 200 (e.g. a micro pick up array carrying a group of micro devices) may be inspected by the inspection camera while the articulating transfer head assembly 200 moves between the carrier substrate stage 104 and receiving substrate stage 106 to verify efficacy of the transfer operations. Operation of mass transfer tool 100 and articulating transfer head assembly 200 may be controlled at least in part by a computer 108.

Figure 2:
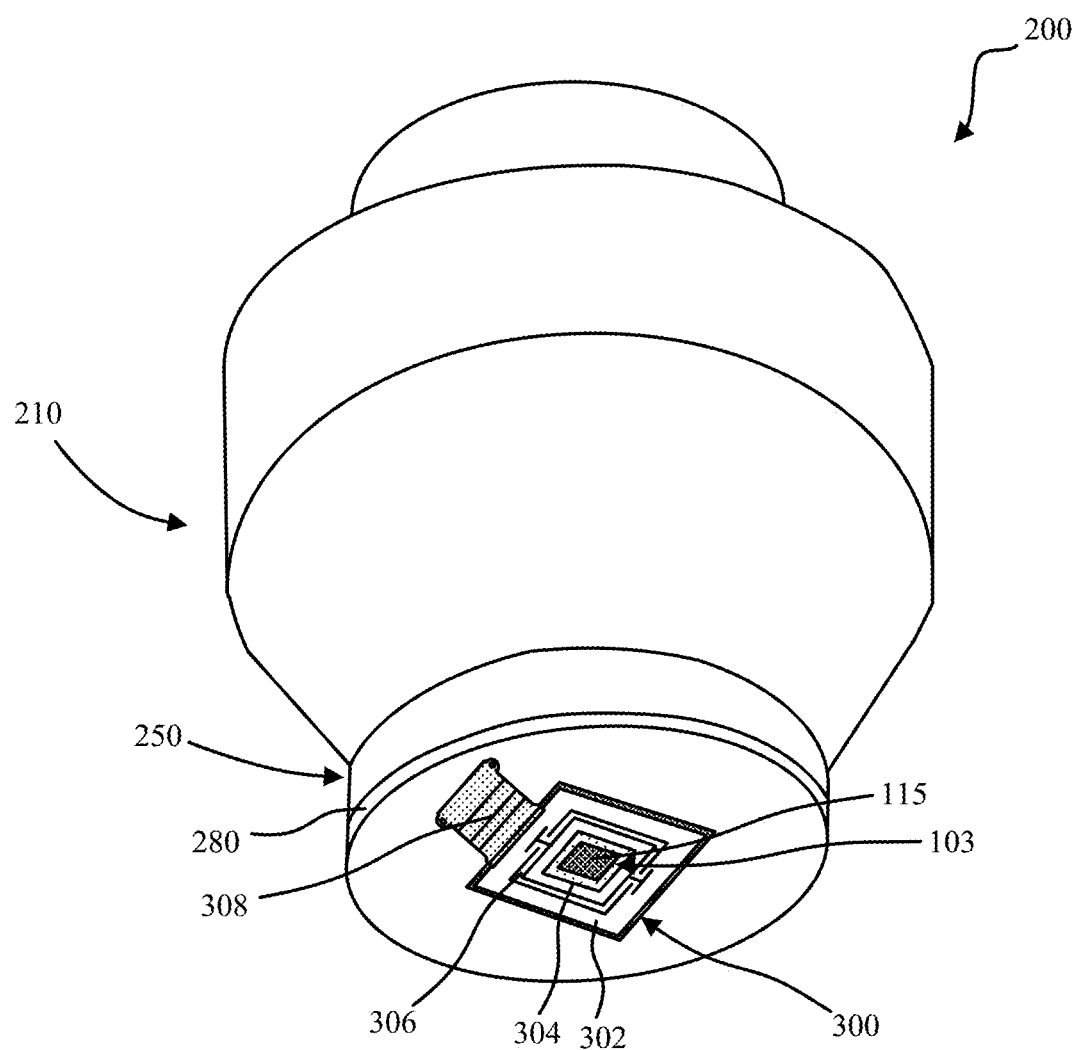
FIG. 2 is an isometric view illustration of a micro pick up array and pivot mount mounted onto an articulating transfer head assembly in accordance with an embodiment.

Referring to FIG. 2, a perspective view of an articulating transfer head assembly 200 is shown in accordance with an embodiment. An articulating transfer head assembly 200 may be used in the mass transfer tool 100 to transfer micro devices to or from a substrate, e.g., receiving substrate or donor substrate, using micro pick up array (MPA) 103 which is supported by a pivot mount assembly 300. The pivot mount assembly 300 may include a support structure (e.g. base) 302, a pivot platform 304, and plurality of spring arms 306, and the MPA 103 supporting an array of electrostatic transfer heads 115 is mounted on the pivot platform 304. In an embodiment, the pivot mount assembly 300 may include a flex circuit 308 to communicate with a printed circuit board (PCB) that is located nearby within the articulating transfer head assembly 200 to reduce signal degradation by limiting a distance that signals must travel.

In an embodiment, the MPA 103 includes an array of electrostatic transfer heads 115, where each transfer head operates in accordance with electrostatic principles to pick up and transfer a corresponding micro device. In an embodiment each transfer head has a localized contact surface characterized by a maximum dimension of 1-300 µm in both the x- and y-dimensions. In an embodiment, each transfer head contact surface has a maximum lateral dimension of 1 to 100 µm, or less. In some embodiments, each transfer head contact surface has a maximum length and width of 20 µm, 10 µm, or 5 µm. Similarly, each micro device, such as an LED or chip, may have a maximum lateral dimension of 1-300 µm or 1-100 µm, such as 20 µm, 10 µm, or 5 µm. The articulating transfer head assembly 200 can include features that allow for the exchange of the MPA and for delivering voltage(s) to the transfer heads to facilitate pick up of a micro device using an electrostatic force.

Referring to both FIGS. 1-2, computer 108 may control the operation of articulating transfer head assembly 200 of the MTT 100. For example, articulating transfer head assembly 200 may include an actuator assembly for adjusting the MPA 103 retained by the transfer head assembly with at least three degrees of freedom, e.g., tipping, tilting, and movement in a z direction, based on feedback signals received from various sensors of the MTT 100. Computer 108 may also control movement of the articulating transfer head assembly 200 along translation track 110 (e.g. x direction) over the carrier substrate stage 104 and receiving substrate stage 106. Additional actuators may be provided, e.g., between mass transfer tool 100 structural components and articulating transfer head assembly 200, carrier substrate stage 104, or receiving substrate stage 106, to provide movement in the x, y, or z direction for one or more of those sub-assemblies. For example, a gantry may support articulating transfer head assembly 200 and move articulating transfer head assembly 200 along an upper beam, e.g., in a direction parallel to an axis of motion of translation track 110. Thus, an array of transfer heads on MPA 103, supported by transfer head assembly 200, and a target substrate (e.g. supported by carrier substrate stage 104 or receiving substrate stage 106) may be precisely moved relative to each other within all three spatial dimensions.

The articulating transfer head assembly 200 in accordance with embodiments may provide for negligible lateral or vertical parasitic motion for small movements of MPA 103, e.g., motion less than about 5 mrad about a neutral position. In an embodiment, the articulating transfer head assembly includes a tip-tilt assembly 210 and a piezoelectric stage assembly 250 mounted underneath the tip-tilt assembly 210. Together the tip-tilt assembly 210 and the piezoelectric stage assembly 250 may provide six degrees of motion. Specifically, the tip-tilt assembly 210 may provide tip ($\theta x$) and tilt ($\theta y$), where the piezoelectric stage assembly 250 provides z motion, x motion, y motion, and rotation ($\theta z$). In the particular embodiment illustrated a mounting plate 280 is secured underneath the piezoelectric stage assembly 250. The pivot mount assembly 300 may be mounted onto the mounting plate 280 using a variety of manners such as using tabs or lips to press the pivot mount assembly against the transfer head assembly 200, bonding, vacuum, electrostatic clamping, or pogo pin array board. The MPA 103 can be mounted on the pivot platform 304 of the pivot mount assembly 300 using suitable techniques such as electrostatic clamps, vacuum, or mechanical clips.

Figure 3A:
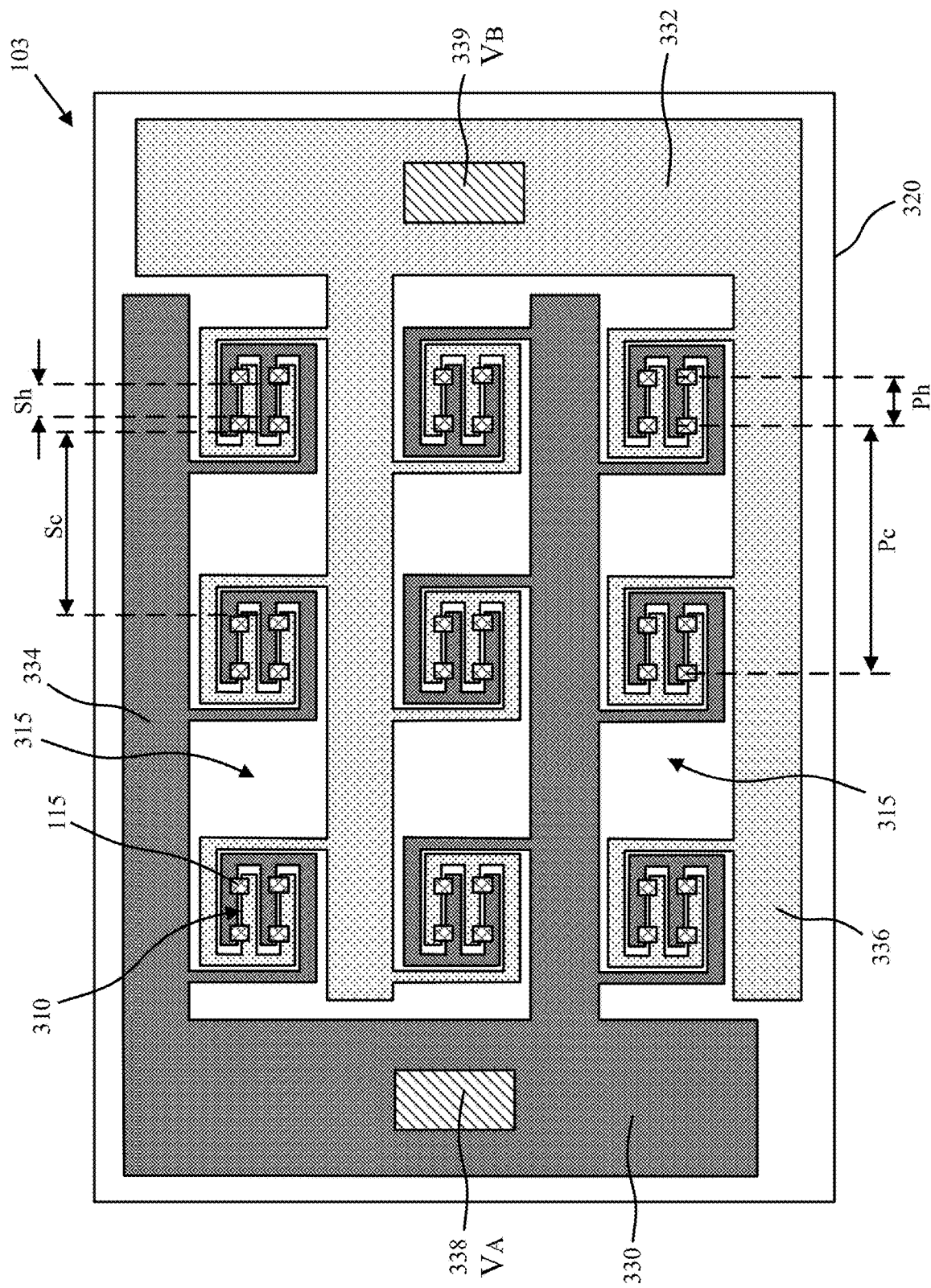
FIG. 3A is a schematic plan view illustration of a micro pick up array including a plurality of clusters of transfer heads in accordance with an embodiment.

Referring now to FIG. 3A, a schematic plan view illustration is provided of an MPA 103 including a plurality of clusters 310 of transfer heads 115 in accordance with an embodiment. In the illustrated embodiment, an MPA 103 includes an array of transfer heads 115 arranged in a plurality of clusters 310, with each cluster 310 including a corresponding plurality of transfer heads 115. The clusters 310 may optionally include rows of transfer heads 115. In an embodiment, adjacent transfer heads 115 within a row of transfer heads within a cluster 310 are separated by an intra-cluster spacing (Sh), and adjacent clusters 310 within a row of clusters are separated by an inter-cluster spacing (Sc) that is greater than the intra-cluster spacing (Sh). Additionally, the clusters 310 of transfer heads may be arranged with an inter-cluster pitch (Pc), and transfer heads 115 within the clusters may be arranged with an intra-cluster pitch (Ph). Inter-cluster pitch (Pc) and intra-cluster pitch (Ph) are both illustrated as having the same dimensions in x-direction (e.g. row-wise) and y-direction (e.g. column-wise) though x-y dimensions may be different. Similarly, columnar spacing may be the same or different from row spacing for intra-cluster spacing (Sh) and inter-cluster spacing (Sc).

In the particular embodiment illustrated, a compliant bi-polar electrostatic transfer head 115 assembly is shown with the darker shading illustrating the electrical connection to a first voltage source ($V_A$), and the lighter shading illustrating the electrical connection to a second voltage source ($V_B$). As shown, the MPA 103 can include an array of compliant bipolar transfer heads 115 connected to an arrangement of trace interconnects 334, 336, and bus interconnects 330, 332. Bus interconnects 330, 332 may be formed around a periphery or outside a working area of the array of transfer heads 115. In an embodiment, voltage contacts 338, 339 may make contact with bus interconnects 330, 332 in order to electrically connect the transfer heads 115 with working circuitry of a transfer head assembly. Where each transfer head 115 is operable as a bipolar transfer head, voltage sources $V_A$ and $V_B$ may simultaneously apply opposite voltages so that the opposing electrodes for each respective transfer head 115 has an opposite voltage. Furthermore, the transfer heads 115 may be deflectable toward/into cavities 315. Each transfer head 115 may be deflectable into a separate cavity 315, or a plurality (or cluster, or clusters) of transfer heads 115 can be deflectable toward/into a same cavity 315.

While the particular embodiment illustrated in FIG. 3A includes four transfer heads arranged in two rows within each cluster 310, this is exemplary, and the clusters 310 may include another number of transfer heads, and may or may not be arranged in rows. Furthermore, it is not required for the transfer heads 115 to be compliant or have bi-polar arrangement. In the following description, additional figures and description are provided for transfer sequences utilizing an MPA 103 similar to that of FIG. 3A, however, it is understood this is exemplary and alternative transfer head 115 arrangements can be used.

Figure 3B:
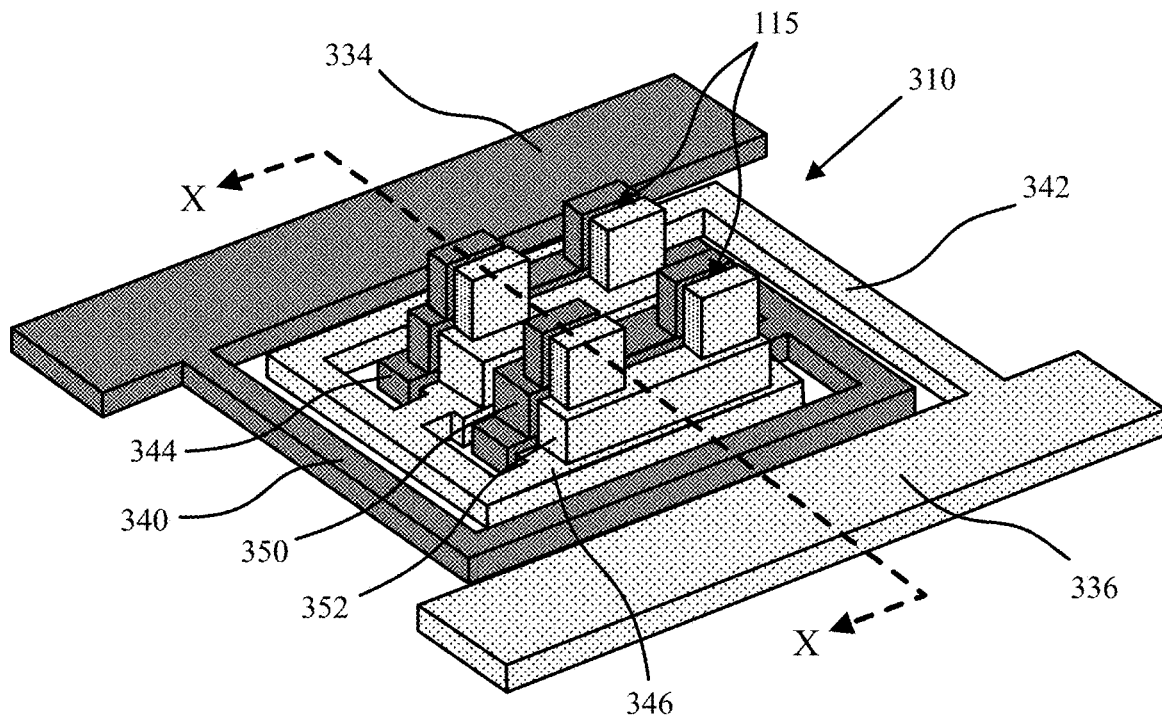
FIG. 3B is an isometric view illustration of a portion of a micro pick up array including a cluster of transfer heads in accordance with an embodiment.
Figure 3C:
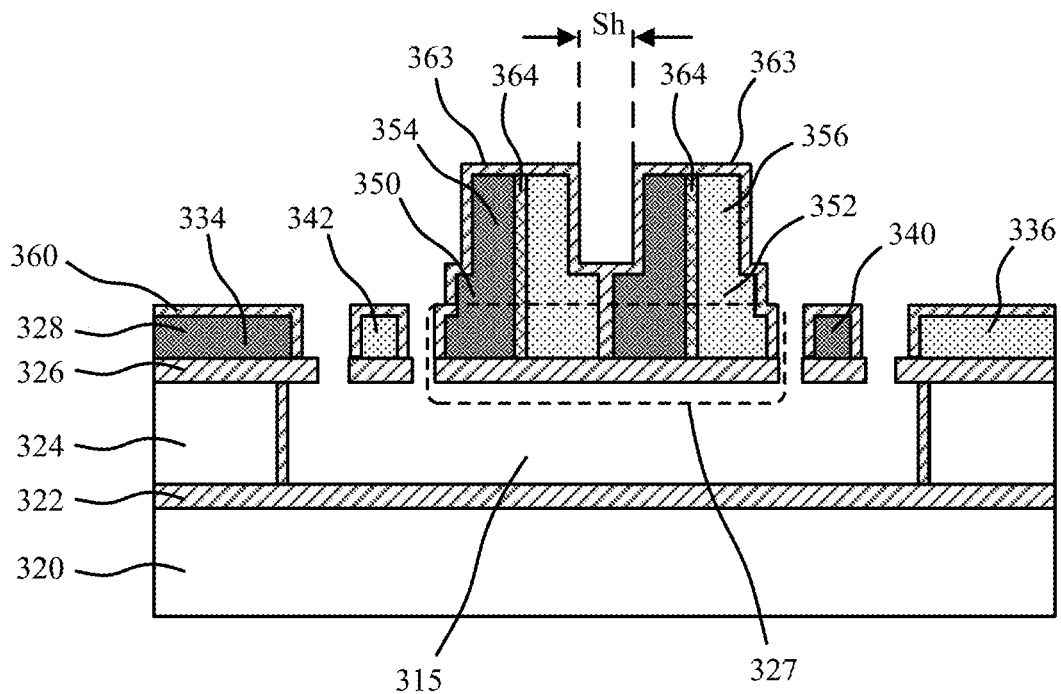
FIG. 3C is a schematic cross-sectional side view taken along line X-X of FIG. 3B in accordance with an embodiment.

Referring now to FIGS. 3B-3C, FIG. 3B is an isometric view illustration of a portion of an MPA including a cluster 310 of transfer heads 115 in accordance with an embodiment; FIG. 3C is a schematic cross-sectional side view taken along line X-X of FIG. 3B in accordance with an embodiment. As shown, each transfer head 115 may include a spring arm 340, 342 extending from a corresponding trace interconnect 334, 336 to a spring platform 327 that supports the corresponding plurality of transfer heads 115 for a corresponding cluster 310. The spring platform 327 may be deflectable toward cavity 315 such that all transfer heads 115 for a cluster 310 are deflected together. In alternative embodiments, each transfer head 115 may be supported by a separate spring platform 327, which can be separately deflectable toward the cavity 315. A variety of spring structures and spring arm configurations can be used to achieve a specified compliance.

In the particular embodiment illustrated the spring platform 327 can be formed in part by interdigitated finger traces 344, 346 that extend from spring arms 340, 342 respectively. Spacing between finger traces 344, 346 may optionally be filled with a dielectric layer 360 material which can physically join the finger traces 344, 346 together and provide further robustness to the structure. In the bipolar configuration each transfer head can include a pair of mesa structures 354, 356, which can optionally be separated by a dielectric joint 364. In an embodiment, the dielectric joints 364 are parallel to each row of transfer heads.

Each cluster 310 can include a plurality of submesa interconnects 350, 352, where each submesa interconnect 350, 352 spans underneath a corresponding mesa structure 354, 356 for a plurality of transfer heads 115 within a row of transfer heads. Specifically, the mesa structures 354, 356 may protrude from the submesa interconnects 350, 352. As shown, a first plurality of first submesa interconnects 350 is coupled with a same first voltage source $V_A$, and a second plurality of second submesa interconnects 352 is coupled with a same second voltage source $V_B$. Furthermore, each cluster 310 can include a plurality of finger traces 344, 346 spanning underneath a corresponding mesa structure 354, 356 for a plurality of transfer heads within a row of transfer heads 115. Specifically, the submesa interconnects 350, 352 may protrude from the finger traces 344, 346.

Referring now to the schematic cross-sectional side view illustration of FIG. 3C, the MPA 103 may be formed with a silicon-on-insulator (SOI) type substrate stack. As shown, this may include a base substrate 320, such as a silicon wafer. A cavity template layer 324 can optionally be located over the base substrate 320 for the formation of cavities 315. Cavity template layer 324 may be separated from the base substrate 320 with a lower insulating layer 322, such as an oxide (e.g. $SiO_2$). Alternatively, cavities 315 can be formed in the base substrate 320. An upper insulating layer 326, such as an oxide (e.g. $SiO_2$) can be formed on the cavity template layer 324, and a device layer 328 on the upper insulating layer 326. In accordance with embodiments, the device layer 328 and cavity template layer 324 may be formed of silicon. In an embodiment, the device layer 328 may be doped to improve conductivity.

The device layer 328, and upper insulating layer 326, may be patterned with multiple masks to form the bus interconnects 330, 332, trace interconnects 334, 336, spring arms 340, 342, finger traces 344, 346, submesa interconnects 350, 352, and mesa structures 354, 356. One or more top dielectric layers 360 may be formed over the patterned device layer 328, and a top surface of the dielectric layer 360 on the top surfaces of the mesa structures 354, 356 can form the contact surfaces 363 for the transfer heads 115. Dielectric joint 364 may optionally be formed of the same material as dielectric layer 360, though different materials may be used. For example, dielectric layer 360 may be formed of a variety of oxides to provide a specified dielectric strength, and hence pick up pressure for the transfer heads 115.

A variety of factors may be considered when designing a particular transfer head 115 assembly, including pixel density (PPI) of the display substrate to which the LEDs are transferred. An increased pixel density may affect the number of LEDs and transfer heads 115 that can fit within an inter-subpixel pitch. Furthermore, there may be minimum LED size requirements for system efficiency, and compliance tolerances for the compliant transfer heads particularly when multiple transfer heads share a common spring platform which can result in some amount of torque due to off-center loading.

Figure 4A:
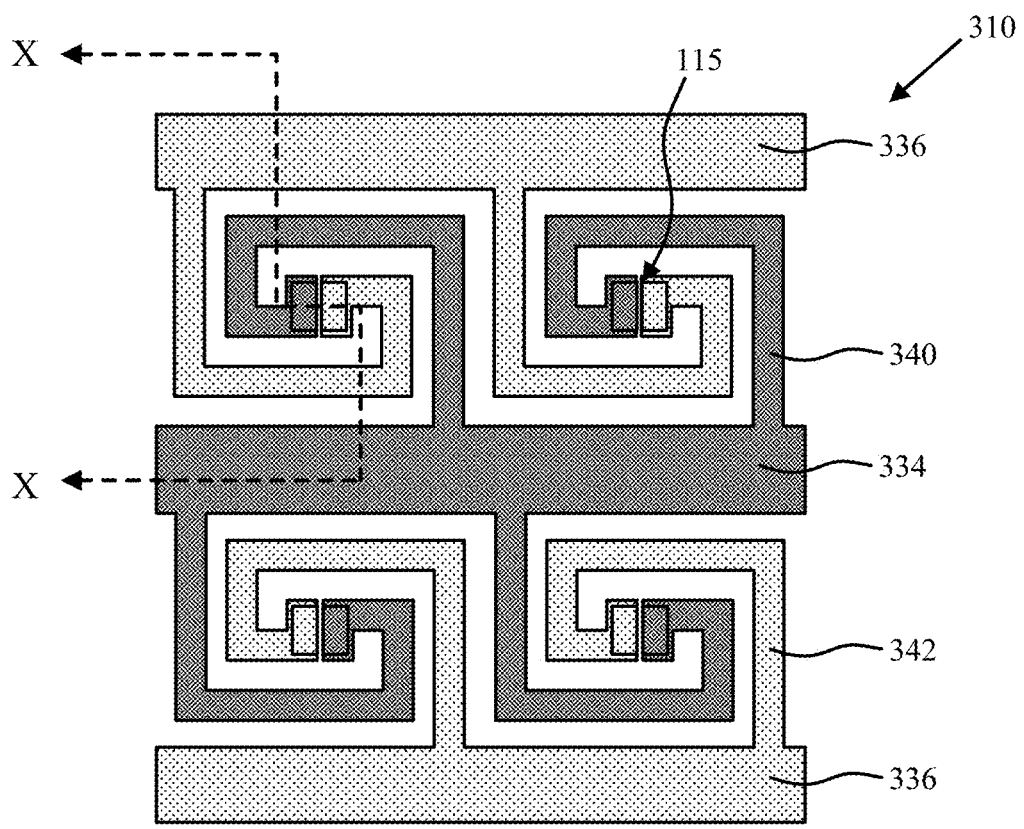
FIG. 4A is a schematic top view illustration of a portion of a micro pick up array including a cluster of transfer heads with separate spring platforms in accordance with an embodiment.
Figure 4B:
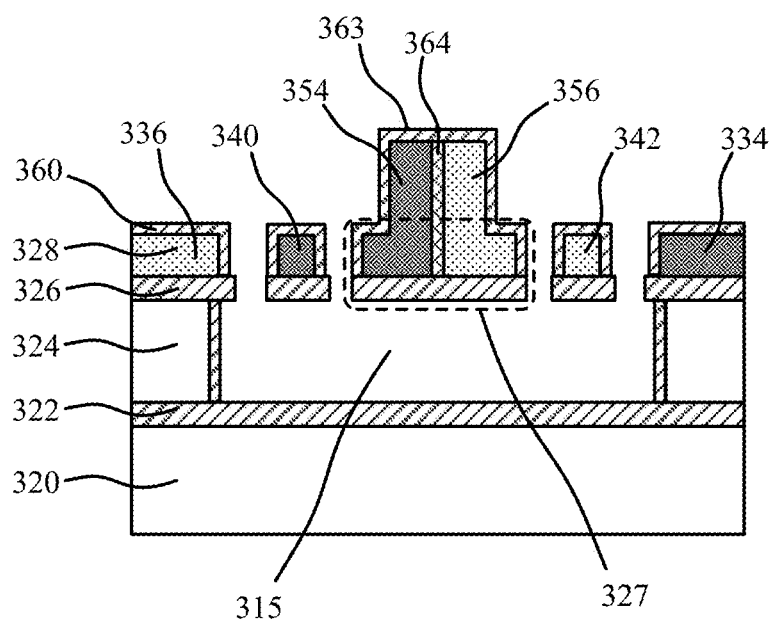
FIG. 4B is a schematic cross-sectional side view taken along line X-X of FIG. 4A in accordance with an embodiment.

Referring now to FIGS. 4A-4B, FIG. 4A is a schematic top view illustration of a portion of an MPA including a cluster 310 of transfer heads 115 with separate spring platforms 327 in accordance with an embodiment; FIG. 4B is a schematic cross-sectional side view taken along line X-X of FIG. 4A in accordance with an embodiment. FIGS. 4A-4B are similar to the arrangement of FIGS. 3A-3B with a double side clamped cantilever beam arrangement of spring arms 340, 342 and spring platform 327. Likewise, the cluster 310 of FIGS. 4A-4B can be arranged with the plan layout of FIG. 3A. Dimensions of the parts can be altered to achieve a specified stiffness and deflection limit.

Up until this point cluster 310 grouping has been described with 2×2 arrangements of transfer heads 115. However, cluster 310 groupings can be adjustable in a variety of other patterns, including other row-column arrangements and non-row-column arrangements.

Figure 5:
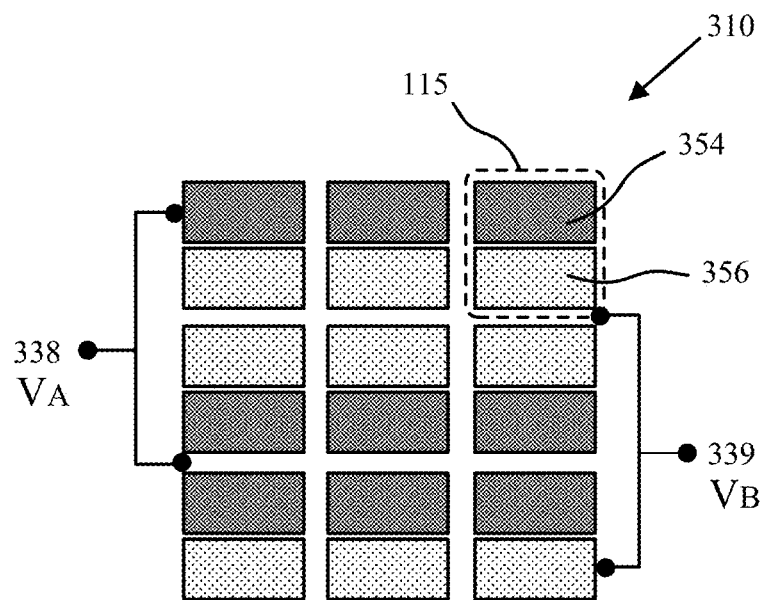
FIG. 5 is a schematic plan view illustration of a portion of a micro pick up array including a cluster of transfer heads with shared submesas and polarities in accordance with an embodiment.
Figure 6:
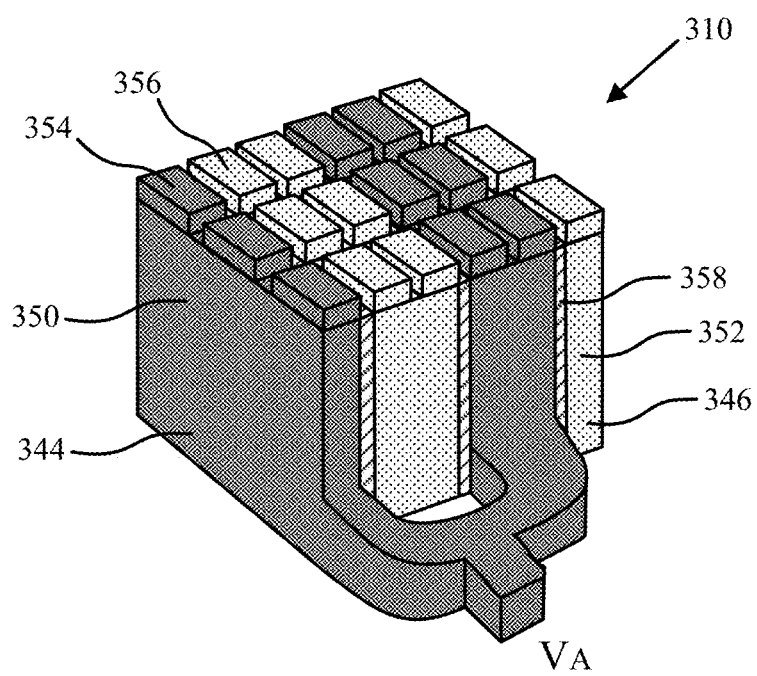
FIG. 6 is an isometric view illustration of a portion of a micro pick up array including a cluster of transfer heads with shared submesas and polarities in accordance with an embodiment.

FIG. 5 is a schematic plan view illustration of a portion of a micro pick up array including a cluster of transfer heads with shared submesas and polarities in accordance with an embodiment. FIG. 6 is an isometric view illustration of a portion of a micro pick up array including a cluster of transfer heads with shared submesas and polarities in accordance with an embodiment. FIGS. 5-6 are substantially similar to the embodiments illustrated in FIGS. 3A-3B with some differences. Firstly, the transfer head 115 grouping within a cluster 310 is a 3×3 arrangement with nine total transfer heads. This arrangement can be scaled, for example, 3×2, 4×4, etc. A second difference illustrated in FIGS. 5-6 is that the mesa structures 354, 356 for transfer heads 115 in immediately adjacent rows or columns can be connected to a shared voltage source, $V_A$ or $V_B$. In this arrangement, interior mesa structures 354, 356 (e.g. those not along outer edge of the cluster 310) can be formed on shared submesa interconnects 350, 352 and/or finger traces 344, 346, which can be interdigitated. Such an arrangement may facilitate densification of the transfer heads 115 within a cluster 310. In the illustrated embodiment, polarity for the mesa structures 354, 356 switches for adjacent transfer heads 115 along a row or column. Adjacent submesa interconnects 350, 352 and/or finger traces 344, 346 can be separated by an insulating material 358 (e.g. oxide, etc.). This may be a similar material to dielectric joint 364, for example.

In an embodiment, an MPA 103 includes a cluster 310 of a plurality of transfer heads 115 arranged in a plurality of rows of transfer heads 115. Each transfer head 115 may be an electrostatic transfer head that includes a first mesa structure 354 and a second mesa structure 356, and a plurality of submesa interconnects 350, 352. Each row of transfer heads 115 may span over a pair of submesa interconnects 350, 352, with each first mesa structure 354 protruding from a first submesa interconnect 350 and each second mesa structure 356 protruding from a second submesa interconnect 352.

The plurality of submesa interconnects can include a first plurality of first submesa interconnects 350 coupled to a same first voltage source (VA), and a second plurality of submesa interconnects 352 coupled with a same second voltage source (VB). In the embodiment illustrated in FIG. 6, the first mesa structures 354 for a first row of transfer heads 115 and the first mesa structures 354 for a second row of transfer heads can both protrude from a same first submesa interconnect 350. Similarly, the second mesa structures 356 for the second row of transfer heads 115 and second mesa structures 356 for a third row of transfer heads 115 protrude from a same second submesa interconnect 352.

While the above description with regard to FIGS. 3A-6 has been with regard to multi-polar transfer heads, and bi-polar transfer heads in particular, embodiments are not so limited. For example, the transfer heads may be monopolar transfer heads. Alternatively, the transfer heads may be elastomeric stamps, including elastomeric contact surfaces. Utilization of transfer heads with single mesa structures can facilitate scaling down the size of the transfer heads, which can allow for higher density clusters, and also the transfer of smaller devices.

Figure 7A:
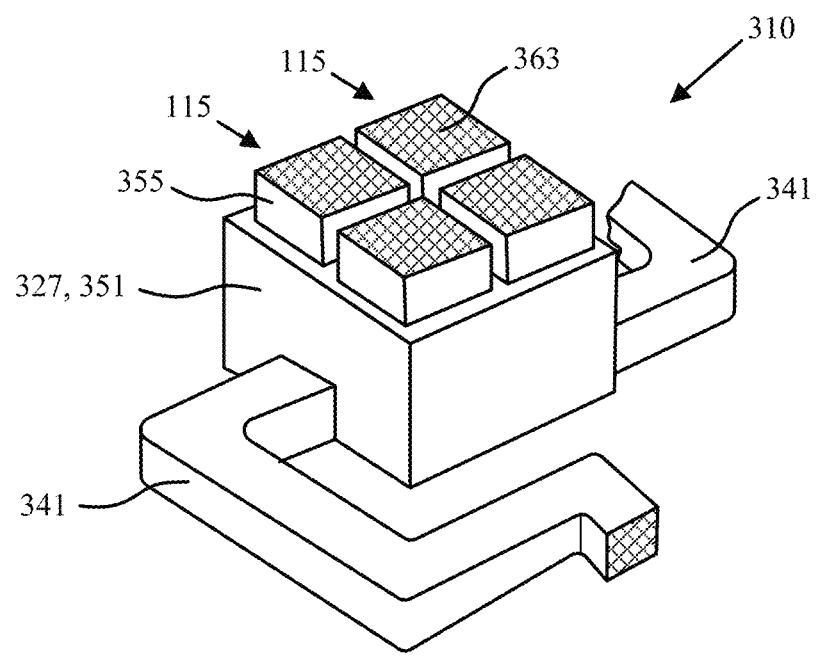
FIG. 7A is an isometric view illustration of a portion of a micro pick up array including a cluster of monopolar transfer heads in accordance with an embodiment.
Figure 7B:
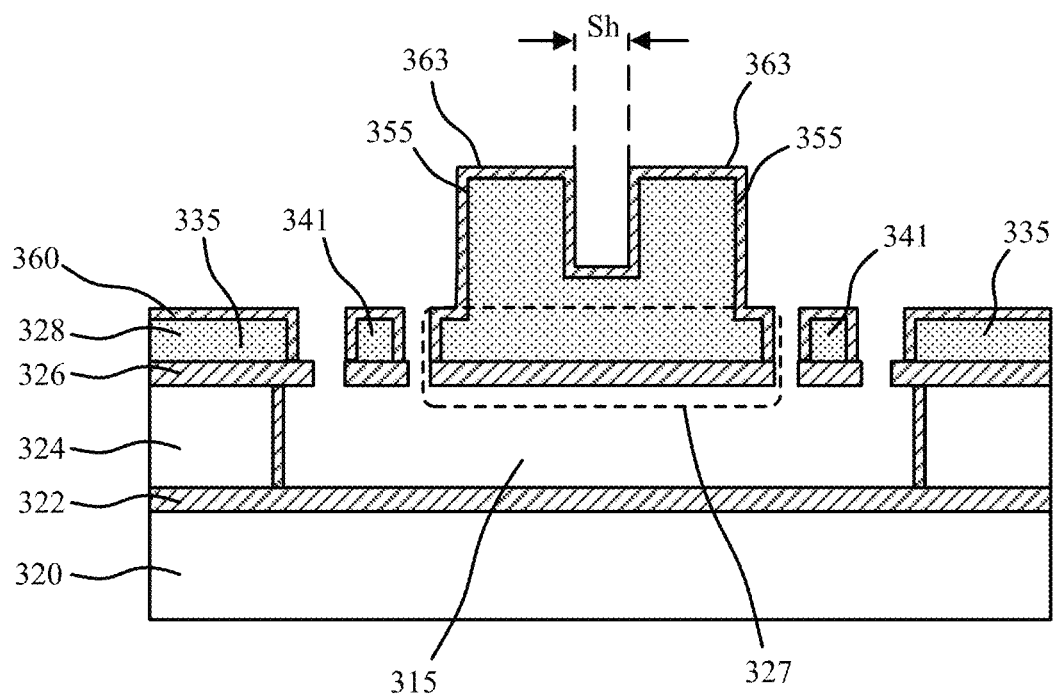
FIG. 7B is a schematic cross-sectional side view of the cluster of monopolar transfer heads of FIG. 7A in accordance with an embodiment.

FIG. 7A is an isometric view illustration of a portion of a micro pick up array including a cluster 310 of monopolar transfer heads 115 in accordance with an embodiment. FIG. 7B is a schematic cross-sectional side view of the cluster of monopolar transfer heads of FIG. 7A in accordance with an embodiment. FIGS. 7A-7B are similar to the arrangement of FIGS. 3A-3B with a double side clamped cantilever beam arrangement of spring arms 341 and spring platform 327. Likewise, the cluster 310 of FIGS. 7A-7B can be arranged with the plan layout of FIG. 3A. Dimensions of the parts can be altered to achieve a specified stiffness and deflection limit. As shown a cluster of monopolar transfer heads can be supported by the same spring platform 327. The spring arms 341 may be connected to the same voltage source for a monopolar configuration.

The device layer 328, and upper insulating layer 326, may be patterned with multiple masks to form the bus interconnects, trace interconnects 335, spring arms 341, spring platform 327, optional submesa interconnects 351, and mesa structures 355. One or more top dielectric layers 360 may be formed over the patterned device layer 328, and a top surface of the dielectric layer 360 on the top surfaces of the mesa structures 355 can form the contact surfaces 363 for the transfer heads 115. For example, dielectric layer 360 may be formed of a variety of oxides to provide a specified dielectric strength, and hence pick up pressure for the transfer heads 115.

Figure 8A:
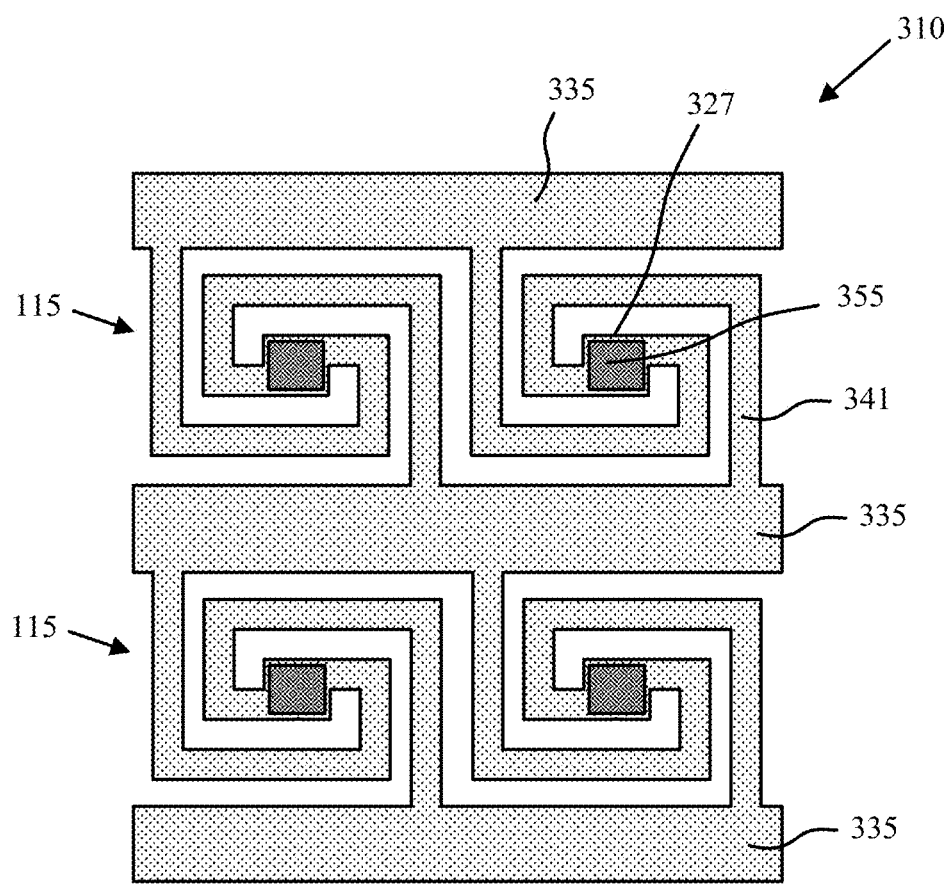
FIG. 8A is a schematic top view illustration of a portion of a micro pick up array including a cluster of monopolar transfer heads with separate spring platforms in accordance with an embodiment.

FIG. 8A is a schematic top view illustration of a portion of a micro pick up array including a cluster 310 of monopolar transfer heads 115 with separate spring platforms 327 in accordance with an embodiment. FIG. 8A is similar to the arrangement of FIGS. 4A-4B with a double side clamped cantilever beam arrangement of spring arms 341 and spring platform 327.

Figure 8B:
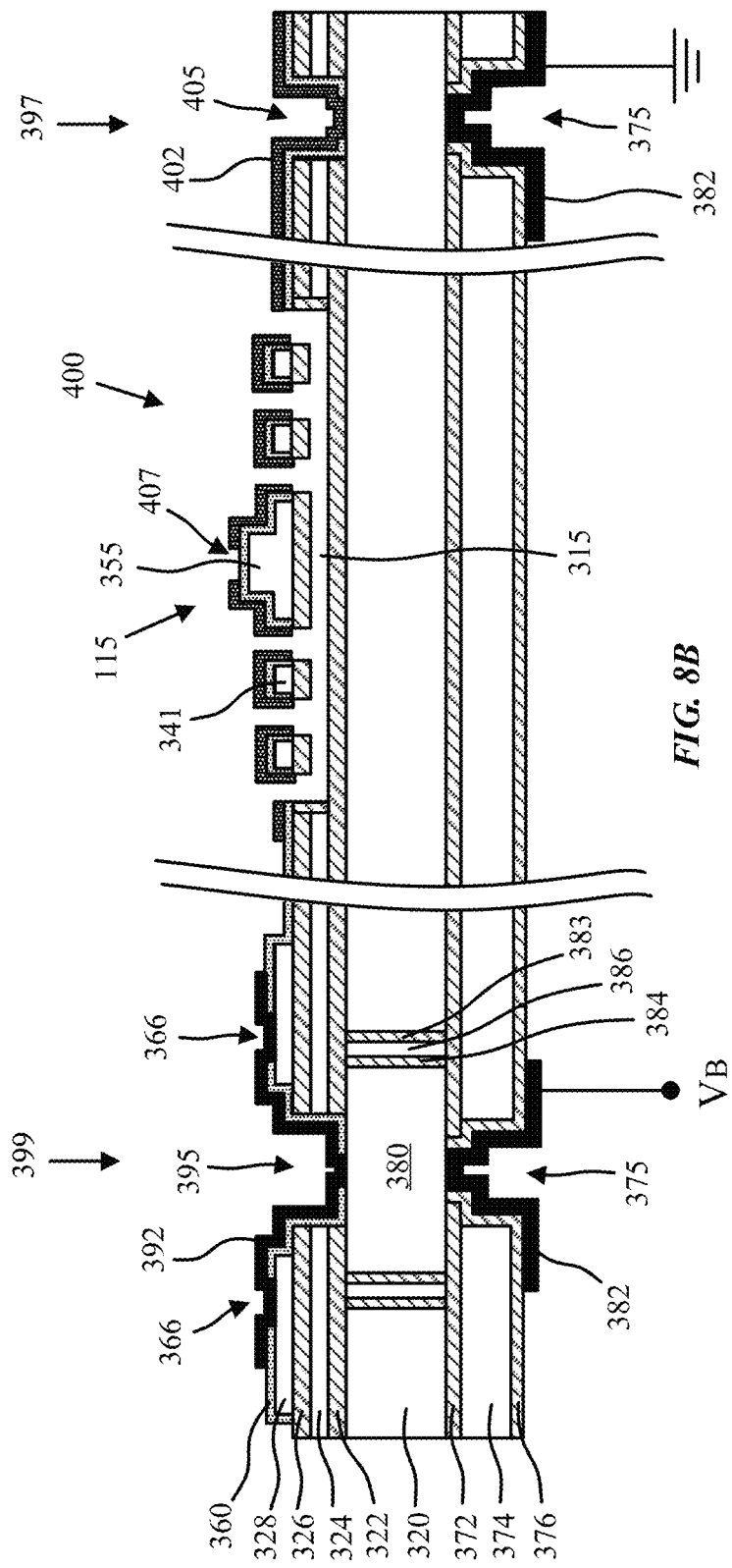
FIG. 8B is a schematic cross-sectional side view illustration of a monopolar transfer head with an electrostatic shield in accordance with an embodiment.
Figure 9A:
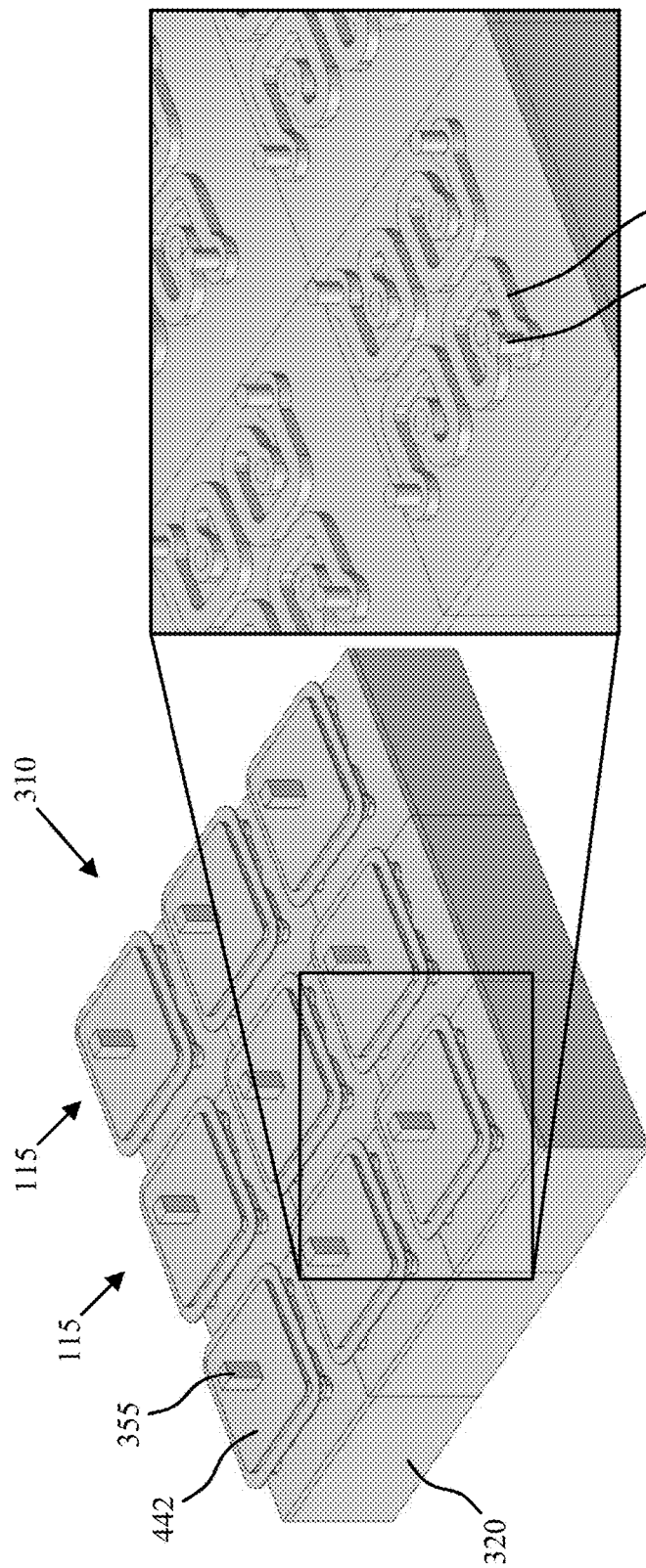
FIG. 9A is an isometric view of a cluster of polycrystalline compliant transfer heads in accordance with an embodiment.
Figure 9B:
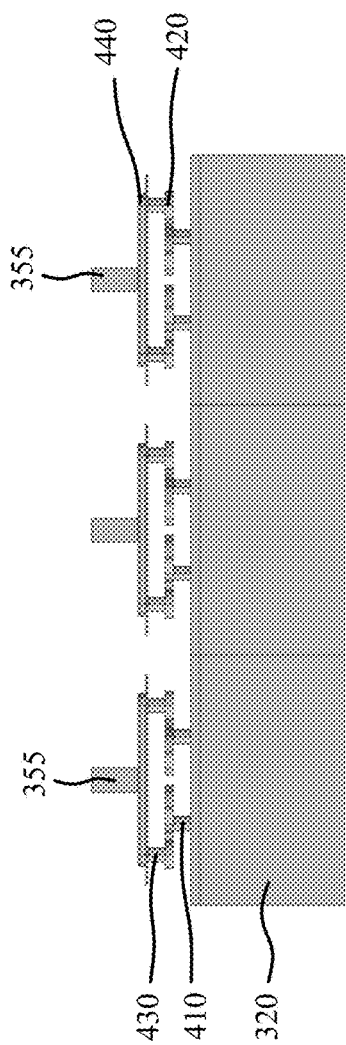
FIG. 9B is a side view illustration of the cluster of polycrystalline compliant transfer heads of FIG. 9A in accordance with an embodiment.
Figure 10A:
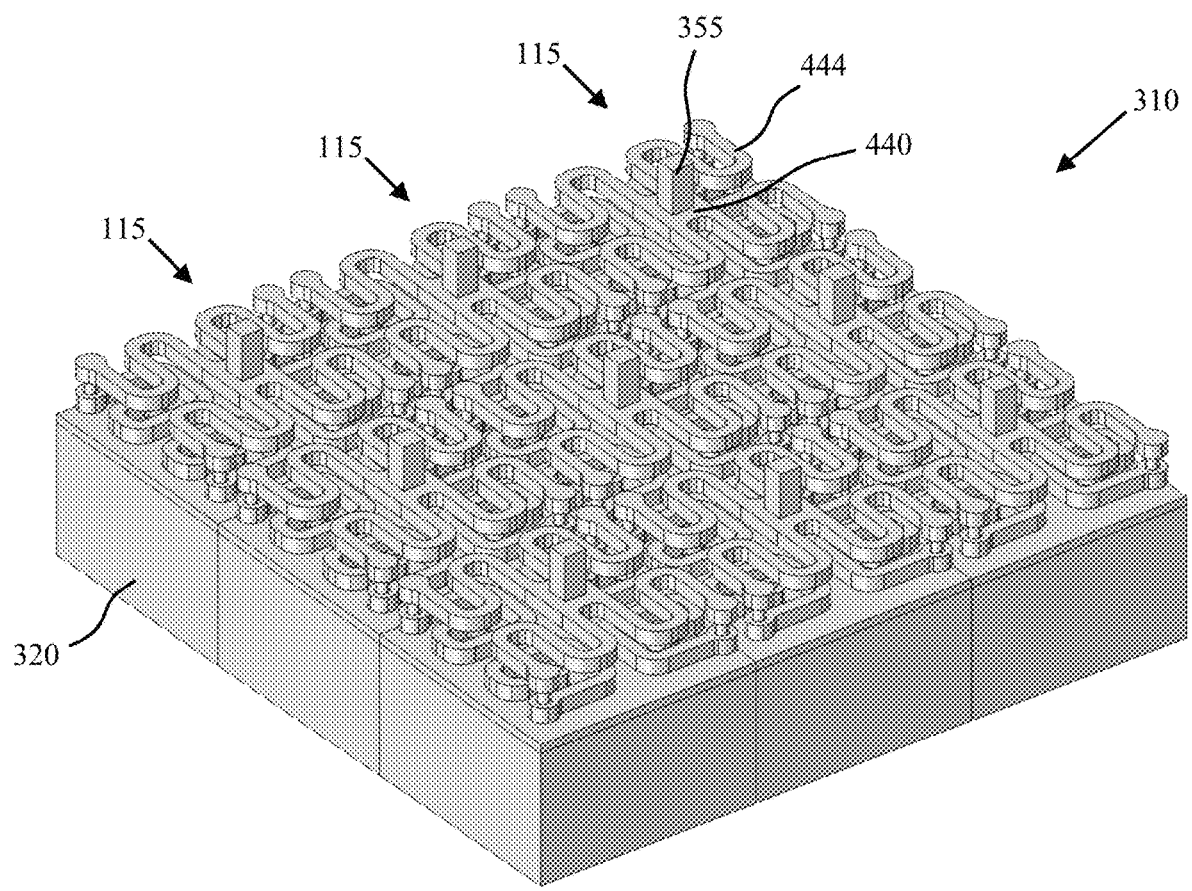
FIG. 10A is an isometric view of a cluster of polycrystalline compliant transfer heads in accordance with an embodiment.
Figure 10B:
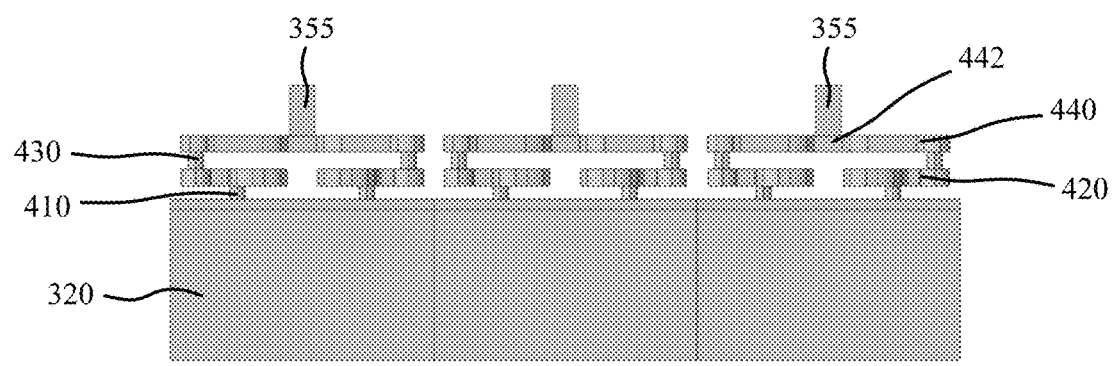
FIG. 10B is a side view illustration of the cluster of polycrystalline compliant transfer heads of FIG. 10A in accordance with an embodiment.

Referring now to FIG. 8B, a schematic cross-sectional side view illustration is provided of a monopolar transfer head 115 with an electrostatic shield 400 in accordance with an embodiment. The particular transfer head 115 of FIG. 8B resembles that of FIG. 8A, though this is exemplary and an electrostatic shield 400 may be incorporated into a variety of monopolar transfer head configurations.

The electrostatic shield 400 includes an electrically conductive layer 402 and may be particularly suitable for monopolar transfer head configurations. For example, single pole clamping of a micro device, such as an LED, operates with a fixed potential on the micro device and a conductive path through the micro device. The electrostatic shield can function hold the micro device at a fixed potential, such as ground, and to shield the micro device from stray electric fields. The electrostatic shield 400 may additionally include apertures over the mesa structures 355, which can function to control the electric field size that is generated. In operation, the electric field is generated by applying a voltage to the array of transfer heads 115 from a first voltage source, while holding the electrostatic shield 400 at a fixed potential with a second voltage source, which may be a ground connection.

The particular illustration in FIG. 8B is a combination view of several different areas of the MPA 103, including a central active area showing one of the array of transfer heads 115, a ground shield contact area to the right side of the illustration, and an operating voltage contact area on the left side of the illustration. Similar to previous discussion, the MPA 103 can include a base substrate 320, a lower insulating layer 322, cavity template layer 324 and cavity 315, an upper insulating layer 326 on the cavity template layer 324, and a device layer 328 on the upper insulating layer 326, and a dielectric layer 360 on the device layer 328. A back side insulation layer 372, such as an oxide, may be formed on the back side of the base substrate 320. A contact template layer 374 can be formed over the back side insulation layer 372 and patterned to form openings 375. A second back side insulation layer 376 may then be formed over the contact template layer 374, and then be patterned to form openings through the back side insulation layer 372. Back side conductive (e.g. metal) layers 382 can then be formed over the openings 375 through the back side insulation layers 372, 376 to form back side contacts which can be used, for example, to connect to a voltage source, such as ground, or a second voltage source ($V_B$) for supplying an operating voltage.

Prior to forming the back side contacts, the base substrate 320 can be patterned to form one or more plugs 380, or another suitable vertical electrical connection. The plug 380 may be formed from the base substrate 320 (e.g. silicon), and may be electrically isolated from the base substrate 320, for example, with sidewall insulation layers 383, 384 (e.g. oxides) and optional fill material 386, such as polymer (e.g. epoxy), paste (e.g. glass), or gel (e.g. silicone) that can be applied in to the opening. The back side conductive layers 382 may be formed on and in electrical contact with the base substrate 320 and plug 380.

Top side contacts may be similarly formed. For example, openings 395 can be formed through any of the lower insulating layer 322, cavity template layer 324, upper insulating layer 326, device layer 328, and dielectric layer 360 to expose the plug 380. A top conductive contact layer 392 can then be formed in the opening 395 to contact the plug 380. The top conductive contact layer 392 can also be formed through a device opening 366 in the dielectric layer 360 to contact the device layer 328 and complete the electrical path from the second voltage source ($V_B$) to the device layer 328 and complete the second voltage source contact 399.

The first voltage source contact 399 is similarly connected. As shown, an opening 405 can be formed through the lower insulating layer 322, cavity template layer 324, upper insulating layer 326, device layer 328, and dielectric layer 360 to expose the base substrate 320. The electrically conductive layer 402 is formed in the opening 405 to contact the base substrate 320. The electrically conductive layer 402 is also patterned to form apertures 407 over the mesa structures 355. For example, the apertures 407 may be circles that are fully enclosed by the electrically conductive layer 402. The electrically conductive layer 402 contacts the base substrate 320 and can be electrically connected with the first voltage source, or ground, through the base substrate 320.

In an embodiment, an MPA includes a base substrate 320, an array of transfer heads 115 over the base substrate, with each transfer head 115 including a mesa structure 355. An electrically conductive layer 402 spans over the mesa structure for each transfer head in the array of transfer heads to form the electrostatic shield 400. For example, the electrically conductive layer 402 may be metal, polysilicon, etc. A first voltage source contact 397 is coupled with the electrically conductive layer 402. For example, the first voltage source contact 397 can be coupled to a voltage source, including ground. The first voltage source contact 397 may also be electrically connected to the base substrate 320. A second voltage source contact 399 is coupled with the array of mesa structures 355 of the array of transfer heads 115. The second voltage source contact 399 may be coupled with a second voltage source ($V_B$) to provide the operating voltage for the transfer heads. The second voltage source contact 399 may include a plug that extends through the base substrate 320, and is electrically isolated from the base substrate.

Referring now to FIGS. 9A-9B and FIGS. 10A-10B isometric and side view illustrations are provided of clusters 310 of polycrystalline compliant transfer heads 115 in accordance with embodiments. The MPAs and arrays of electrostatic transfer heads described up until this point can be fabricated using sequential wafer bonding and patterning of layers, and can also be fabricated using an additive approach of surface micromachining in which the layers are sequentially deposited or grown. The embodiments illustrated in FIGS. 9A-9B and FIGS. 10A-10B may leverage the additive surface micromachining approach for further size reduction, and also the formation of multiple level spring structures for the compliant transfer heads. Specifically, epitaxial layers, such as epitaxial polycrystalline silicon layers, can be sequentially deposited and patterned to bury the spring structures vertically, as opposed to laterally, resulting in space savings for equivalent spring action of a cantilever-type approach.

As shown, an MPA 103 can include a base substrate 320 and an array of polycrystalline compliant transfer heads 115 on the base substrate 320. Each polycrystalline compliant transfer head 115 includes a spring platform 442 and a mesa structure 355 protruding from the spring platform 442. For example, each polycrystalline compliant transfer head 115 may be a monopolar transfer head. Each polycrystalline compliant transfer head 115 further includes a plurality of anchor plugs 410 protruding from the base substrate 320 and connected to a base spring layer 420 at an opposite end. The anchor plugs 410 may optionally be the first epitaxially grown polycrystalline layer of the MPA, or a top surface of the base substrate 320 can include a blanket polycrystalline layer to which the anchor plugs 410 are attached.

The spring layer may include one or more base spring arms 422 connected to the anchor plugs 410 a corresponding vertical interconnect 430. The plurality of vertical interconnects 430 may protrude from the base spring layer 420 and connected to an upper spring layer 440, of which the spring platform 442 is a part. In the particular embodiment illustrated in FIGS. 9A-9B the upper spring layer 440 is the spring platform 442. In the particular embodiment illustrated in FIGS. 10A-10B the upper spring layer 440 includes a plurality of upper spring arms 444 that connect the plurality of vertical interconnects 430 to the spring platform 442. A dielectric layer 360 can be formed over the mesa structures 355 and upper spring layer 440 as previously described. In accordance with embodiments, each of the described layers above the base substrate 320, other than the dielectric layer 360, can be micromachined polycrystalline material, such as polycrystalline silicon.

Figure 11A:
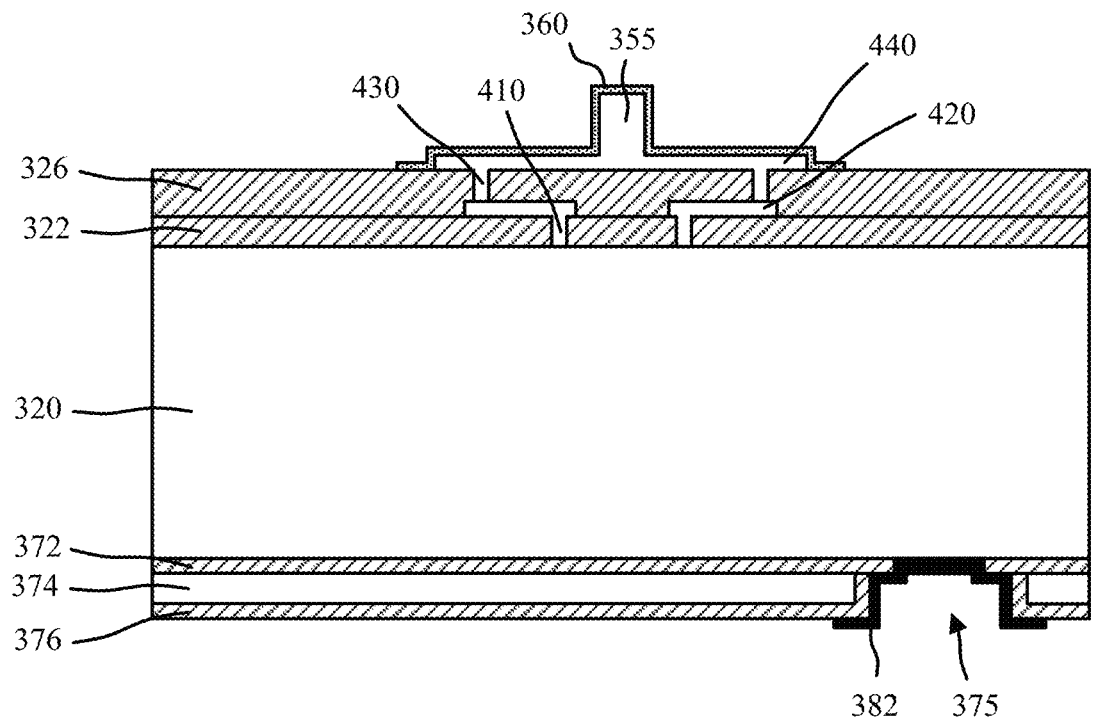
FIG. 11A is a schematic cross-sectional side view illustration of a partially processed micro pick up array including an array of polycrystalline compliant transfer heads in accordance with an embodiment.
Figure 11B:
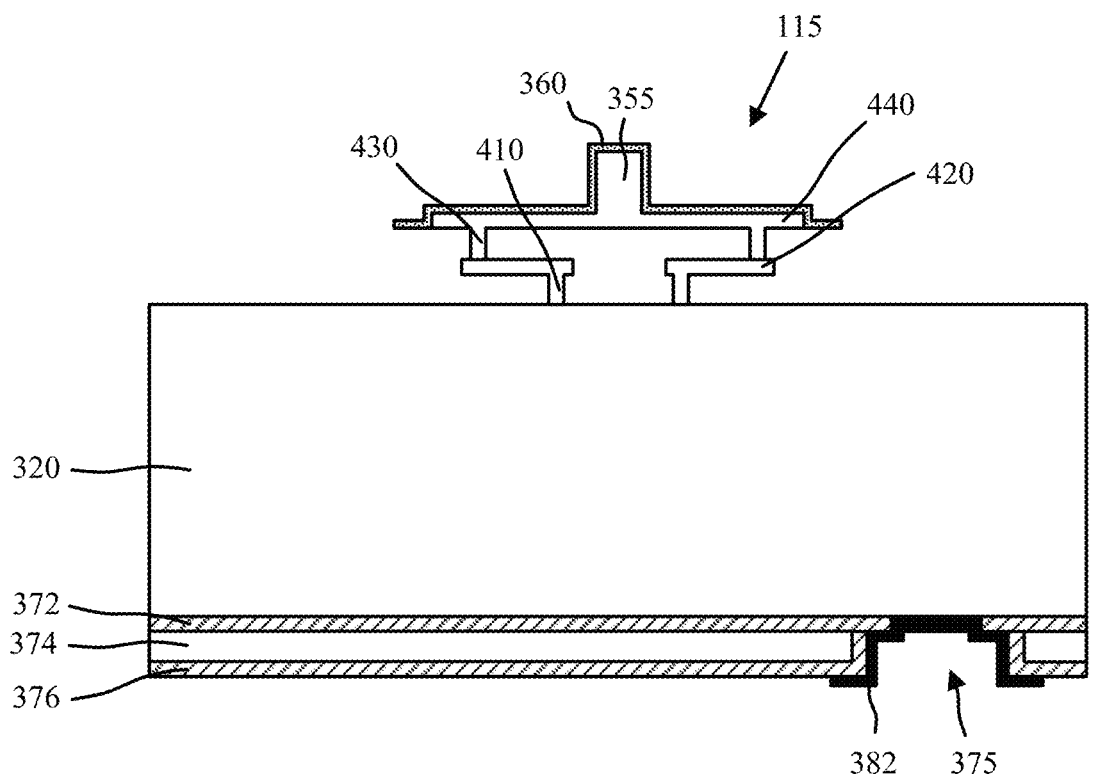
FIG. 11B is a schematic cross-sectional side view illustration of a micro pick up array including an array of polycrystalline compliant transfer heads after removal of sacrificial layers in accordance with an embodiment.

In order to illustrate an exemplary fabrication sequence, a schematic cross-sectional side view illustration is provided in FIG. 11A of a partially processed micro pick up array including an array of polycrystalline compliant transfer heads in accordance with an embodiment. The final structure after etch release of the sacrificial layers is illustrated in FIG. 11B. In an exemplary process flow, the process may begin with a silicon-on-insulator substrate. For example, this may include a base substrate 320, back side insulation layer 372 (which can be the buried oxide layer of the SOI substrate, and a contact template layer 374 (which can be normal device layer of an SOI substrate). A second back side insulation layer 376 may then be formed over the contact template layer 374, and then be patterned to form openings through the back side insulation layer 372. Back side conductive (e.g. metal) layers 382 can then be formed over the openings 375 through the back side insulation layers 372, 376 to form back side contacts which can be used, for example, to connect to a voltage source for supplying an operating voltage. In this case the operating voltage is applied to the base substrate 320, which transfers the operating voltage to the transfer heads 115 that will be formed.

The formation of the transfer heads can then begin with the formation of a lower insulating layer 322 such as an oxide (e.g. $SiO_2$), which can optionally be planarized and then patterned to form openings that will correspond to the anchor plugs 410. An epitaxial layer is then formed over the lower insulating layer 322 and within the openings, and then patterned to form the base spring layer 420 and anchor plugs 410. The epitaxial layer may be a polycrystalline layer, such as polycrystalline silicon. Thus, the anchor plugs 410 and base spring layer 420 may be a single layer. The polycrystalline structure may be at least partially attributed to being formed over an oxide layer (lower insulating layer 322).

The processing sequence is then repeated for the next epitaxial layer, where an upper insulating layer 326 is then formed over the lower insulating layer 322 and the base spring layer 420 and planarized, followed by patterning to form openings that will correspond to the vertical interconnects 430. An epitaxial layer, which may be polycrystalline silicon, is then formed over the upper insulating layer 326 and within the openings, and then patterned to form the mesa structure 355 and upper spring layer 440 (including spring platform 442 and upper spring arms 444 if present). Thus, the anchor plugs vertical interconnects 430, upper spring layer 440 and mesa structures 355 may be a single layer. A dielectric layer 360 can then be formed over the mesa structure 355 and upper spring layer 440 and patterned, resulting in the structure illustrated in FIG. 11A. The dielectric layer 360 may be formed of a material different from the lower insulating layer 322 and upper insulating layer 326 for their selective removal, as shown in FIG. 11B. For example, the dielectric layer 360 may be formed of aluminum oxide.

Figure 11C:
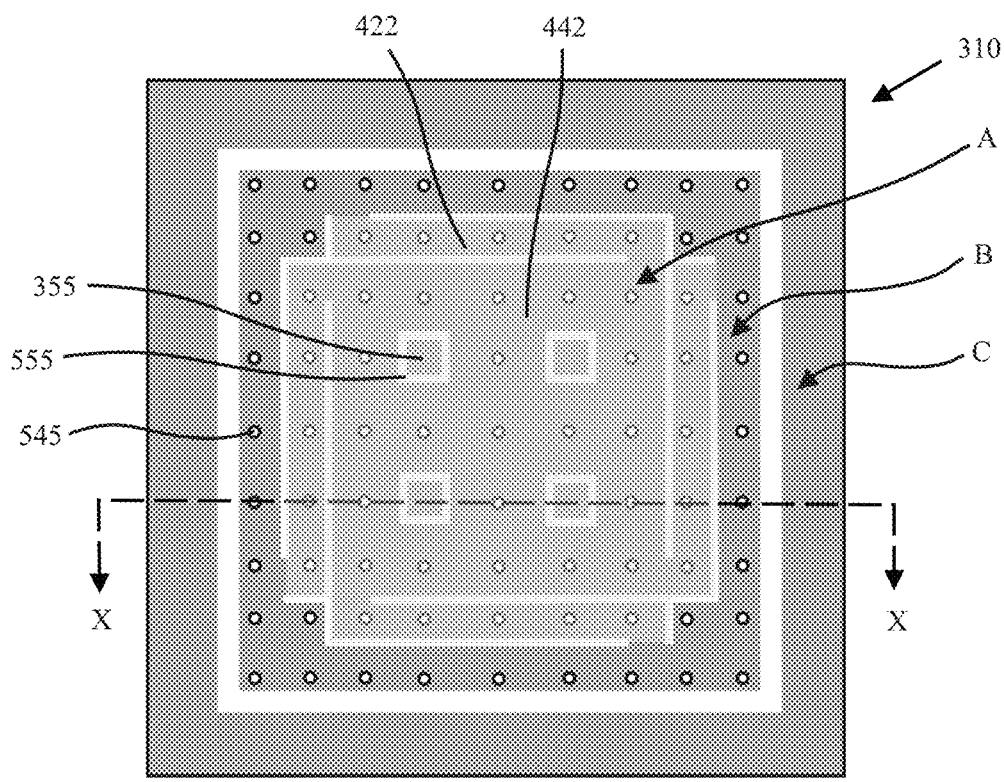
FIG. 11C is a top-down view illustration of a micro pick up array including a cluster of compliant transfer heads in accordance with an embodiment.
Figure 11D:
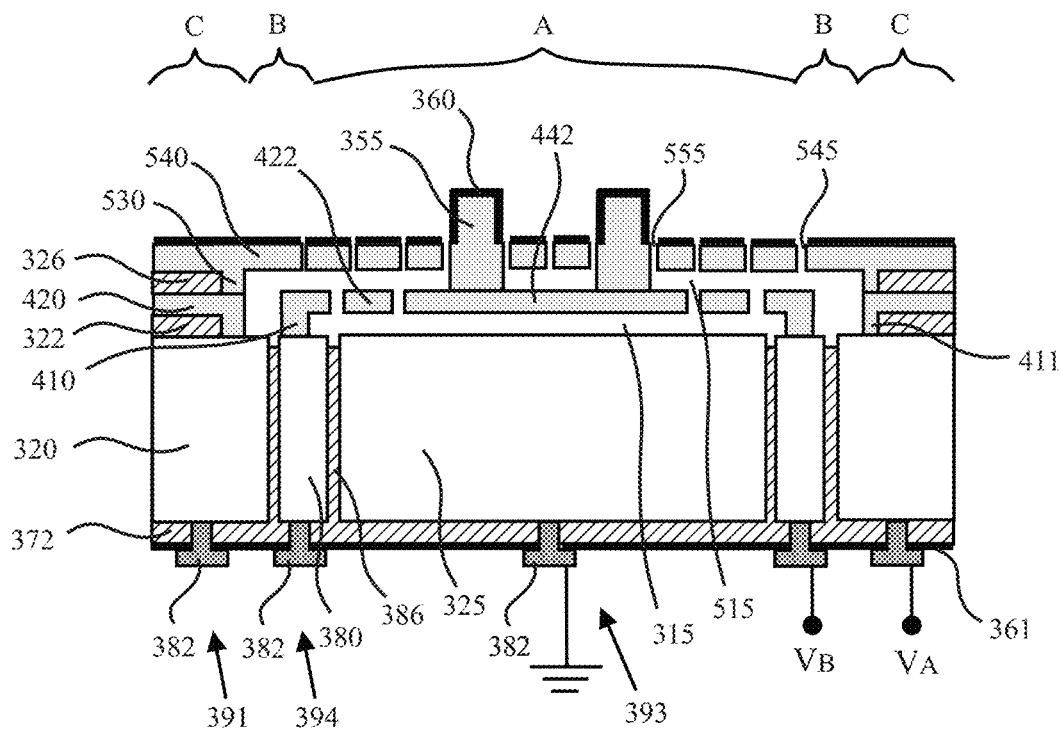
FIG. 11D is a schematic cross-sectional side view illustration taken along line X-X of FIG. 11C in accordance with an embodiment.

Referring to FIGS. 11C-11D, FIG. 11C is a top-down view illustration of a micro pick up array including a cluster 310 of compliant transfer heads 115 in accordance with an embodiment, FIG. 11D is a schematic cross-sectional side view illustration taken along line X-X of FIG. 11C in accordance with an embodiment. In particular, the compliant transfer heads 115 may be polycrystalline compliant transfer heads 115 fabricated using additive surface micromachining methods similar to those of FIGS. 9A-11B. Furthermore, the MPA may include an encapsulation membrane layer 540 over a base spring layer 420, where the mesa structures 355 protrude through openings 555 in the encapsulation membrane layer 540. The mesa structures 355 can be deflectable through the openings 555 toward the base substrate 320 and may do so without deflecting the encapsulation membrane layer 540. Such a configuration may provide encapsulation for the MPA, protecting particles from cavities 315 into which the spring structures are deflectable. Additionally, the encapsulation membrane layer 540 can be held at a fixed potential, or grounded, similarly as the electrically conductive layer 402 previously described to provide an electrostatic shield and facilitate monopolar transfer head configurations.

As shown, an MPA 103 can include a base substrate 320 and a base spring layer 420 over the base substrate 320. The base spring layer 420 can include a plurality of base spring arms 422 and a spring platform 442. One or more mesa structures 355 can be formed on and protrude from the spring platform 442, and an encapsulation membrane layer 540 spans over the base spring layer 420. In an embodiment, the mesa structure(s) 355 protrudes through a corresponding opening 555 in the encapsulation membrane layer 540 and is deflectable through the corresponding opening 555 and toward the base substrate 320. For example, each mesa structure 355 may protrude through a single corresponding opening 555. Alternatively, a plurality of mesa structures 355 can protrude through a same opening 555. The mesa structures 355 may be decoupled from the encapsulation membrane layer 540 such that the mesa structures can be defected toward the base substrate 320 (e.g. toward cavity 315) without deflecting the encapsulation membrane layer 540. In an embodiment, an upper cavity 515 is between and separates the spring platform 442 and the encapsulation membrane layer 540.

In the illustrated embodiment, back side conductive layers 382 may be provided to form voltage source contacts 391, 394, 393 to supply different potentials (e.g. voltages) to the MPA 103. For example, the base substrate 320 may be coupled to a first voltage source contact 391, while the base spring layer 420 is coupled to a second voltage source contact 394. In operation, the second voltage source contact 394 may be connected with a second voltage source ($V_B$) to supply an operating voltage for the transfer heads, while the first voltage source contact 391 is connected with a first voltage source ($V_A$) to hold the encapsulation membrane layer 540 at a different potential, or ground. Furthermore, a region 325 of the bas substrate 320 underneath the spring portion of the base spring layer 420, including the spring platform 442, and base spring arms 422 can be connected to a third voltage source contact 393, and third voltage source which can be ground, the same voltage source ($V_A$) as the remainder of the base substrate 320, or a different voltage source.

In an embodiment, a plug 380 extends through the base substrate 320 to electrically connect the base spring layer 420 and the second voltage source contact 391. Additionally, a plurality of anchor plugs 410 can connect the base spring layer 420 to the plurality of plugs 380 extending through the base substrate 320. The plugs 380 may be formed from the original base substrate 320, or alternatively can be deposited. In such an embodiment, the plugs 380 can be polycrystalline material (e.g. polysilicon). Furthermore, the base spring layer 420, mesa structures 355, and encapsulation membrane layer 540, as well as the anchor plugs 410 and vertical interconnects 530 between the base spring layer 420 and encapsulation membrane layer 540 can be formed of polycrystalline material, such as polysilicon.

Formation of the transfer heads of FIGS. 11C-11D may begin with a base substrate 320 (e.g. silicon wafer) that has been processed to include plugs 380, fill material 386, lower insulating layer 322 on a top side of the base substrate, and back side insulation layer 372 on a back side of the base substrate 320. Contact hole etching can then be performed to form openings in the lower insulating layer 322 to expose the base substrate and plugs 380. An epitaxial layer is then formed over the lower insulating layer 322 and within the openings, and then patterned to form the base spring layer 420 (including base spring arms 422, spring platform 442), anchor plugs 410, and base contacts 411. The epitaxial layer may be a polycrystalline layer, such as polycrystalline silicon (polysilicon). Thus, the base spring layer 420, anchor plugs 410 and base contacts 411 may be a single layer. Anchor plugs 410 can be formed on and in contact with the plugs 380 to transfer the operating voltage to the mesa structures 355 to be formed. Base contacts 411 can be formed on and in contact with the base substrate 320 for transfer of potential to the encapsulation membrane layer 540 to be formed. Base contacts 411 may be additionally be used in a further processing operation for removal of the sacrificial layers to form cavities 315, 515.

The processing sequence is then repeated for the next epitaxial layer, where an upper insulating layer 326 is then formed over the lower insulating layer 322 and the base spring layer 420 and planarized, followed by patterning to form openings that will be the mesa structures 355 and vertical interconnects 530. An epitaxial layer, which may be polycrystalline silicon, is then formed over the upper insulating layer 326 and within the openings, and then patterned to form the mesa structures 355 and encapsulation membrane layer 540. Dielectric layer 360 may then be formed over the mesa structures 355 and encapsulation membrane layer 540. This may optionally include forming a back side dielectric layer 361 of the same or different material on the back side insulation layer 372. For example, the dielectric layer 360 and back side dielectric layer 361 may be aluminum oxide. This may be followed by patterning openings in the back side dielectric layer 361 and back side insulation layer 372 to expose the base substrate 320 and plugs 380, and deposition of back side conductive (e.g. metal) layers 382 to form voltage source contacts 391, 394, 393.

At this point openings (e.g. holes) 545 may be formed through the dielectric layer 361 and encapsulation membrane layer 540 to expose the upper insulating layer 326, which is also connected to the lower insulating layer 322. Openings 555 can also be formed around the mesa structures 355 to decouple the mesa structures from the deposited encapsulation membrane layer 540. An etch release operation, e.g. vapor hydrofluoric acid (HF), may then be performed to remove portions of the upper insulating layer 326 and lower insulating layer 322 to form cavity 315 and upper cavity 515. In accordance with embodiments, cavity area may be contained by base contacts 411 and vertical interconnects 530 (e.g. walls).

Referring again to FIG. 11C, the white areas illustrate the openings 545 used for etch release of the spring structure, as wells as openings 555 around the mesa structures 355 and spring gaps (e.g. base spring arms 422). The lighter shaded area A may correspond to the spring area of the base spring layer 420. Area B may correspond to an overlap of the released encapsulation membrane layer 540 confined by lateral edges of the upper cavity 515. Area C may correspond to the anchored regions where both the encapsulation membrane layer 540 and base spring layer 420 are rigidly anchored to the base substrate 320.

In the foregoing discussion various transfer head structures have been described, including elastomeric stamps, monopolar transfer heads, bi-polar transfer heads, etc. with particular arrangements in clusters. In particular various aspects of the embodiments facilitate being adopted in a cluster arrangement with a dense grouping of transfer heads. However, it is be appreciated that while the embodiments may be applicable to cluster arrangements, the described transfer head structures may be implemented in other arrangements to facilitate high density transfer sequences and are not limited to cluster arrangements.

Figure 12A:
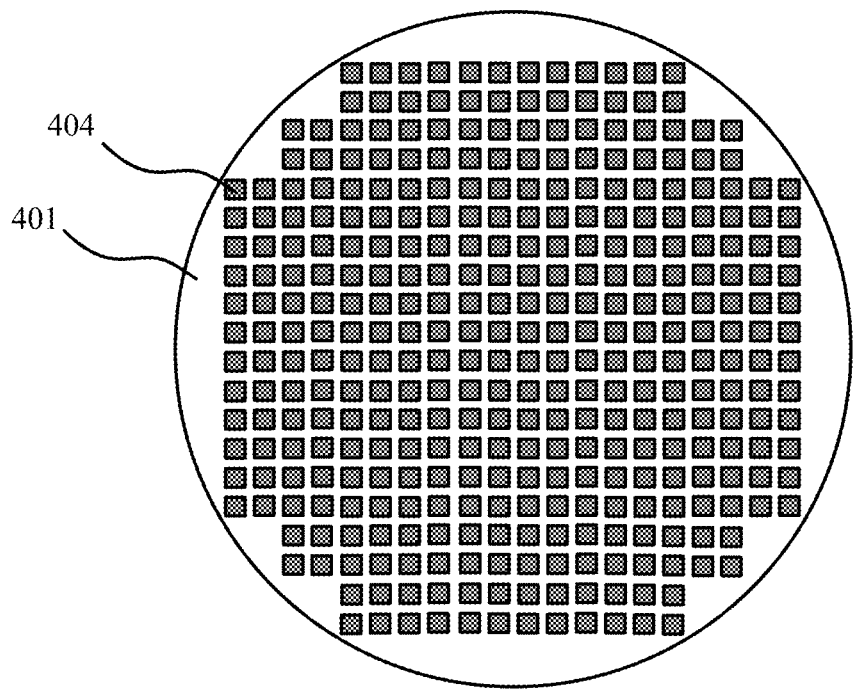
FIG. 12A is a schematic top view illustration of a donor wafer including an array of LEDs in accordance with an embodiment.
Figure 12B:
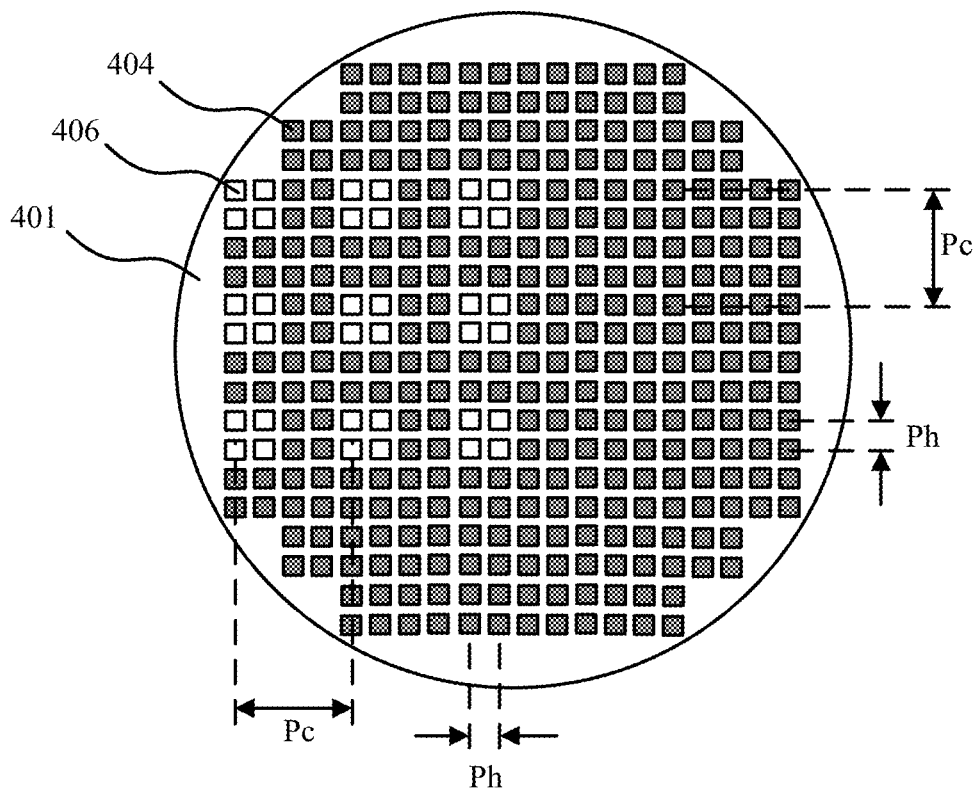
FIG. 12B is a schematic top view illustration of a donor wafer of FIG. 12A after picking a plurality of clusters of LEDs with a micro pick up array including a plurality of clusters of transfer heads in accordance with an embodiment.

Referring now to FIGS. 12A-12B, a donor substrate 401 including an array of LEDs 404 is illustrated in FIG. 12A, and FIG. 12B is an illustration of the donor wafer of FIG. 12A after picking a plurality of clusters of LEDs 404 with an MPA 103 including a plurality of clusters 310 of transfer heads 115 in accordance with an embodiment, where the white areas 406 illustrate missing LEDs 404 after being picked. In application, the contact surfaces 363 of the transfer heads 115 may have approximately a same size as the LEDs 404, though this is not necessarily required. Arrangements of the transfer heads 115 and clusters 310 may be pitch-matched with integer multiples of the pitch between adjacent LEDs 404. As shown, the inter-cluster pitch (Ph) between transfer heads 115 may be an integer multiple (in this case one) of the pitch between adjacent LEDs 404. In the illustrated example, the inter-cluster pitch (Pc) between clusters 310 of transfer heads 115 is an integer multiple (in this case four) of the pitch between adjacent LEDs 404. Inter-cluster pitch (Pc) and intra-cluster pitch (Ph) are both illustrated as having the same dimensions in x-direction (e.g. row-wise) and y-direction (e.g. column-wise) though x-y dimensions may be different. It is to be appreciated that the illustrations in FIGS. 12A-12B are not to actual scale and are for illustrational purposes only. Furthermore, the size and spacing of the clusters 310 of transfer heads 115 is provided as a specific implementation of the embodiments, though embodiments are not limited to these specific arrangements.

Once the LEDs 404 have been picked from the donor substrate 401, the articulating transfer head assembly 200 including the MPA 103 with transfer heads 115 holding the LEDs 404 can be translated toward and positioned over a receiving substrate. During translation, the articulating transfer head assembly 200 and MPA 103 may pass over an upward facing inspection camera 120 as described with regard to FIG. 1 to inspect the bottom surface of the MPA 103 to verify the pick operation efficacy.

Figure 13:
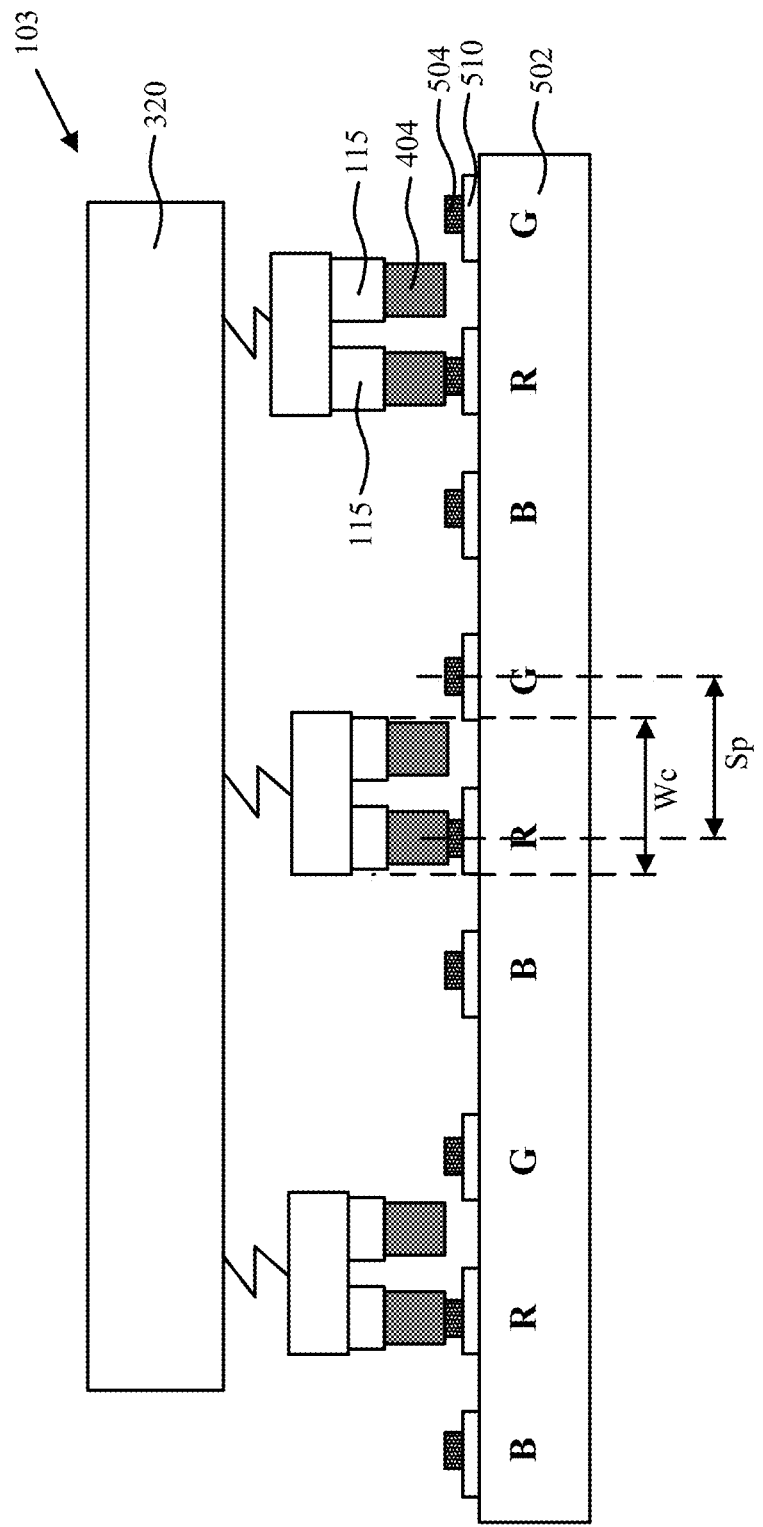
FIG. 13 is a schematic side view illustration of a micro pick up array holding a plurality of clusters of LEDs over a display substrate in accordance with an embodiment.

FIG. 13 is a schematic side view illustration of an MPA 103 holding a plurality of clusters of LEDs 404 over a display substrate 502 in accordance with an embodiment. For a color display panel, the display substrate 502 may include arrays of landing pads 510 (e.g. driver pads) to receive LEDs 404 for different color emission. A bonding material 504, such as a solder material can be provided on each landing pad 510 to help receive and bond each LED 404. Illustrated is a simplified arrangement for a red-green-blue (RBG) display with landing pads 510 to receive red-emitting, green-emitting, and blue-emitting LEDs. Selection of RGB display is exemplary, and embodiments are not limited to a specific color set or arrangement pattern.

Still referring to FIG. 13, a particular operation is illustrated in which a plurality of clusters of LEDs 404 are being placed, and bonded, to a plurality of corresponding landing pads 510 corresponding to red-emitting subpixels. As shown, the adjacent subpixels are separated by an inter-subpixel pitch (Sp), and a cluster width (Wc) of the cluster 310 of transfer heads 115, and also for the corresponding LEDs 404 held by the cluster 310 of transfer heads 115 may fit within the inter-subpixel pitch (Sp). As shown, where transfer heads 115 are designed to be approximately the same size as the LEDs 404, the cluster width (Wc) for the corresponding LED and transfer head clusters may be approximately the same.

As shown in FIG. 13, a pixel density (PPI) of the display substrate 502 may affect the number of LEDs and transfer heads 115 that can fit within an inter-subpixel pitch (Sp). Furthermore, inter-subpixel pitch (Sp) may not always be the same in x-y dimensions. For example, inter-subpixel pitch (Sp) may be greater row-wise, and tighter column-wise. Alternatively, intra-subpixel pad pitch for same color-emitting LEDs may be less than inter-subpixel pitch (Sp) between different color-emitting LEDs. For example, this may occur where redundant LEDs are placed within a same subpixel. Furthermore, fabrication of the landing pads 510 and underlying topography of the display substrate 502 may be designed so that the non-bonding transfer heads 115 and LEDs 404 in this particular transfer operation do not make contact with any underlying structures.

Figure 14A:
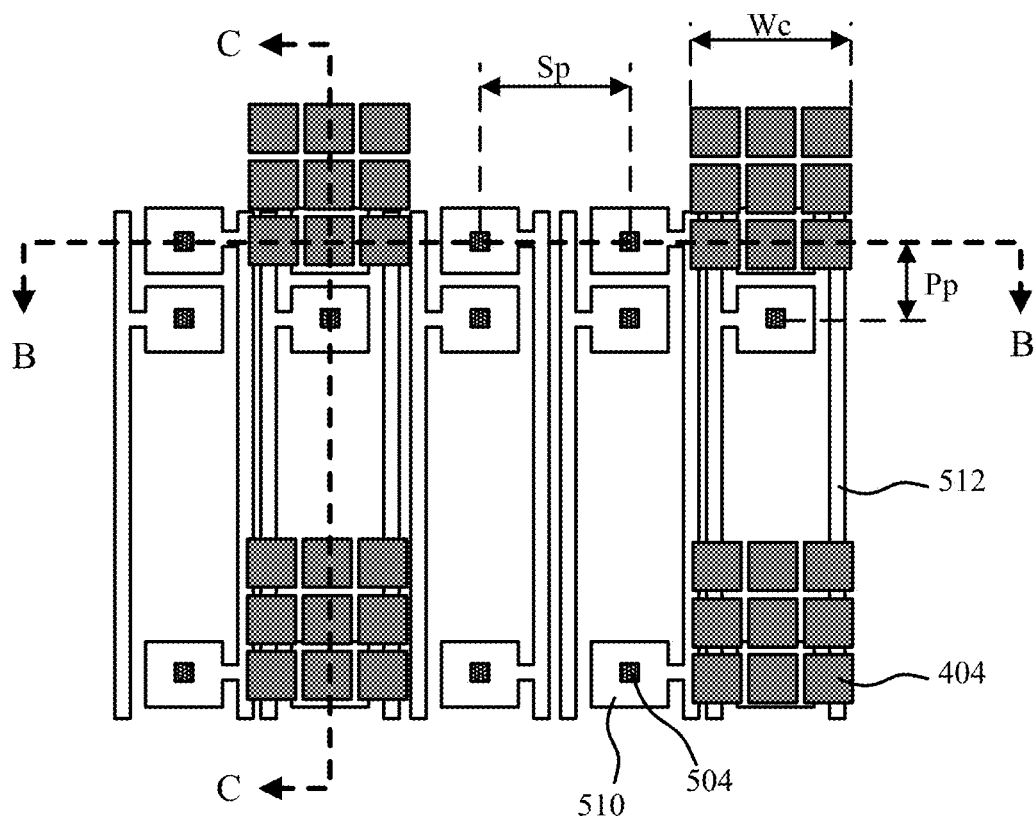
FIG. 14A is a schematic top view illustration of a micro pick up array including clusters of transfer heads holding clusters of LEDs over a display substrate in accordance with an embodiment.
Figure 14B:
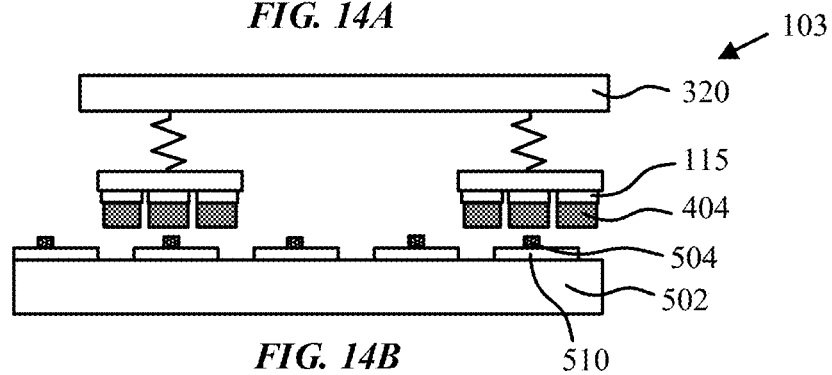
FIG. 14B is a schematic cross-sectional side view illustration taken along line B-B of FIG. 14A in accordance with an embodiment.
Figure 14C:
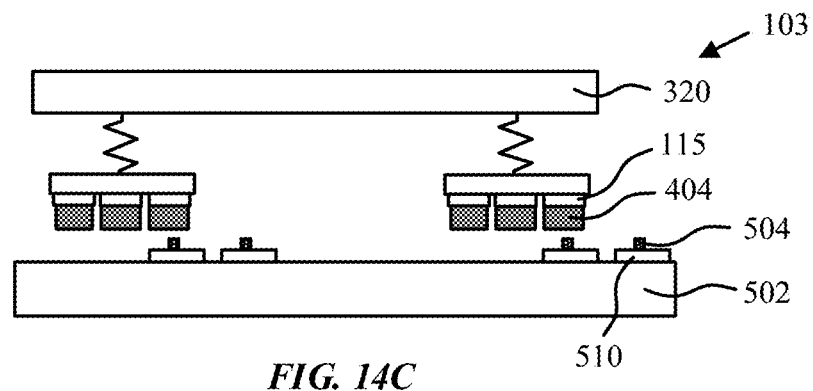
FIG. 14C is a schematic cross-sectional side view illustration taken along line C-C of FIG. 14A in accordance with an embodiment.

FIG. 14A is a schematic top view illustration of an MPA including clusters of transfer heads holding clusters of LEDs 404 over a display substrate that includes landing pads 510 connected to distribution lines 512 in accordance with an embodiment. FIG. 14B is a schematic cross-sectional side view illustration taken along line B-B of FIG. 14A in accordance with an embodiment. FIG. 14C is a schematic cross-sectional side view illustration taken along line C-C of FIG. 14A in accordance with an embodiment. In particular, FIGS. 14A-14C illustrate an implementation of a 3×3 arrangement of transfer heads 115 within a cluster 310, where inter-subpixel pitch (Sp) is different in x-y dimensions. As shown, a row of transfer heads and corresponding LEDs 404 within a cluster 310 fits within the inter-subpixel pitch (Sp) in a row of subpixels. Specifically, the cluster width (Wc) of the cluster 310 of transfer heads 115, and also for the three corresponding LEDs 404 fit within the x-direction inter-subpixel pitch (Sp). However, an intra-subpixel pad pitch (Pp) between pads for same color-emitting LEDs within same subpixels may be less than the inter-subpixel pitch (Sp), and also may be less than the cluster width (Wc) of the cluster 310 of transfer heads 115, and also for the corresponding LEDs 404. In the illustrated embodiment, two rows of transfer heads 115, and corresponding rows of LEDs 404, may fit within the intra-subpixel pad pitch (Pp) between landing pads 510 to accommodate the transfer sequence for all of the LEDs 404.

Figure 15A:
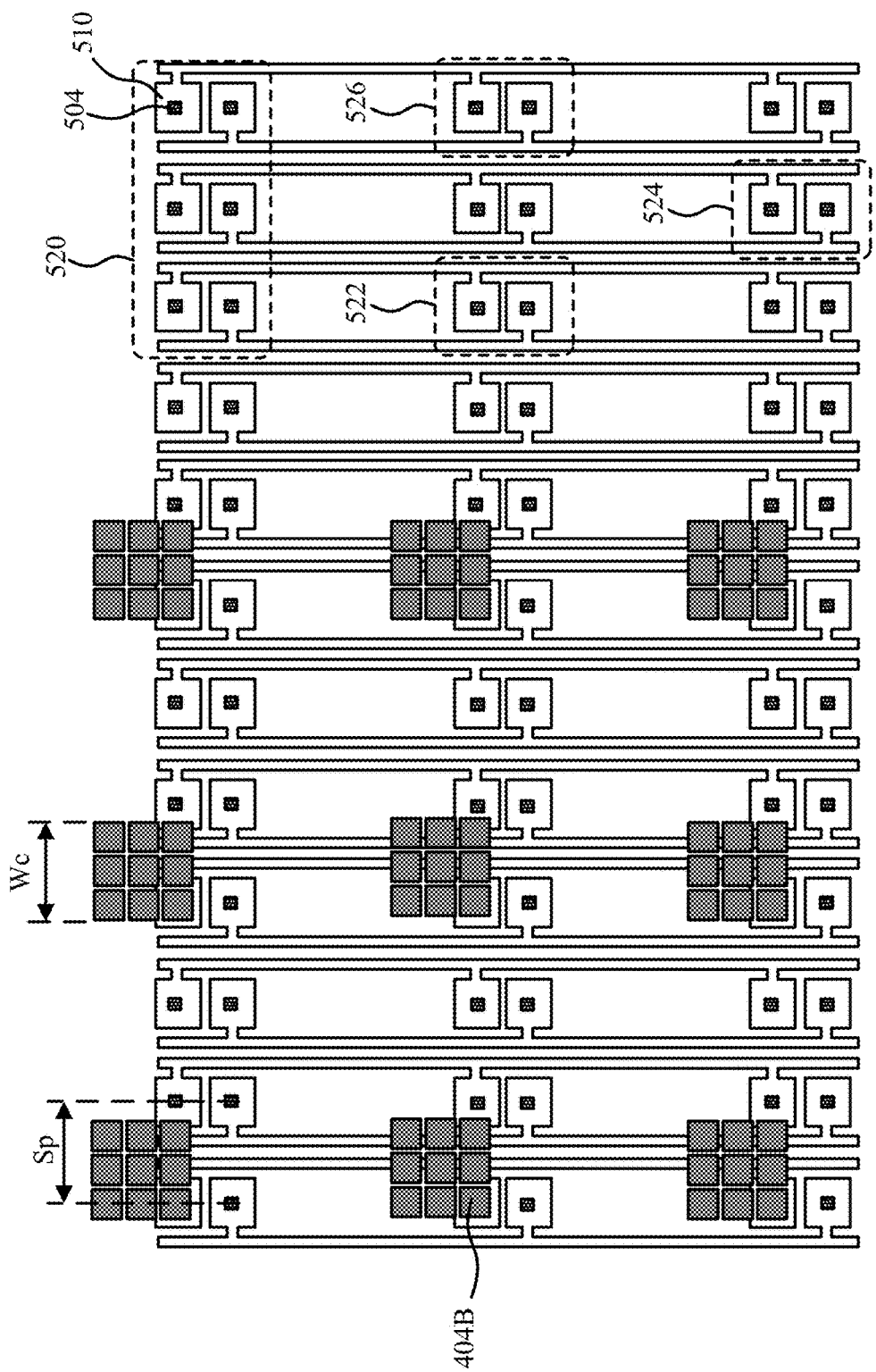
FIGS. 15A-15C are plan view illustrations of a single pick and multiple place sequence for a plurality of first color-emitting LEDs in accordance with an embodiment.

Referring now to FIGS. 15A-15I plan view illustrations are provided for a process sequence for single pick and multiple placement of three different color-emitting LEDs in accordance with embodiments, for example, to populate an RGB display panel. As shown, the display substrate includes an array of landing pads 510 arranged in groups of pixels 520, including subpixels 522, 524, 526. In an exemplary RGB display panel, the subpixels 522, 524, 526 may accommodate blue-emitting LEDs, red-emitting LEDs, and green-emitting LEDs, respectfully, to form an RGB display. Furthermore, each subpixel may include a pair of landing pads 510 to accommodate placement of redundant LEDs. FIG. 16 is a process flow for a sequence of transferring a group of LEDs with a micro pick up array comprising a plurality of clusters of transfer heads in accordance with an embodiment. In interest of clarity and conciseness the following description of the process flow of FIG. 16 is made with regard to the sequence illustrated in FIGS. 15A-15I.

At operation 1610 a first group of blue-emitting LEDs 404B is picked up from a first donor substrate with an MPA 103 including a plurality of clusters 310 of transfer heads 115. The MPA 103 is then positioned over a first location of a display substrate at operation 1620, followed by placement of a first blue-emitting LED 404B of the first group of LEDs from each cluster 310 onto the display substrate at operation 1630. In the particular embodiment illustrated, the lower left-hand blue-emitting LED 404B is placed onto a landing pad 510, though this is merely exemplary and any LED within the clusters can be placed over a corresponding landing pad 510.

Figure 15B:
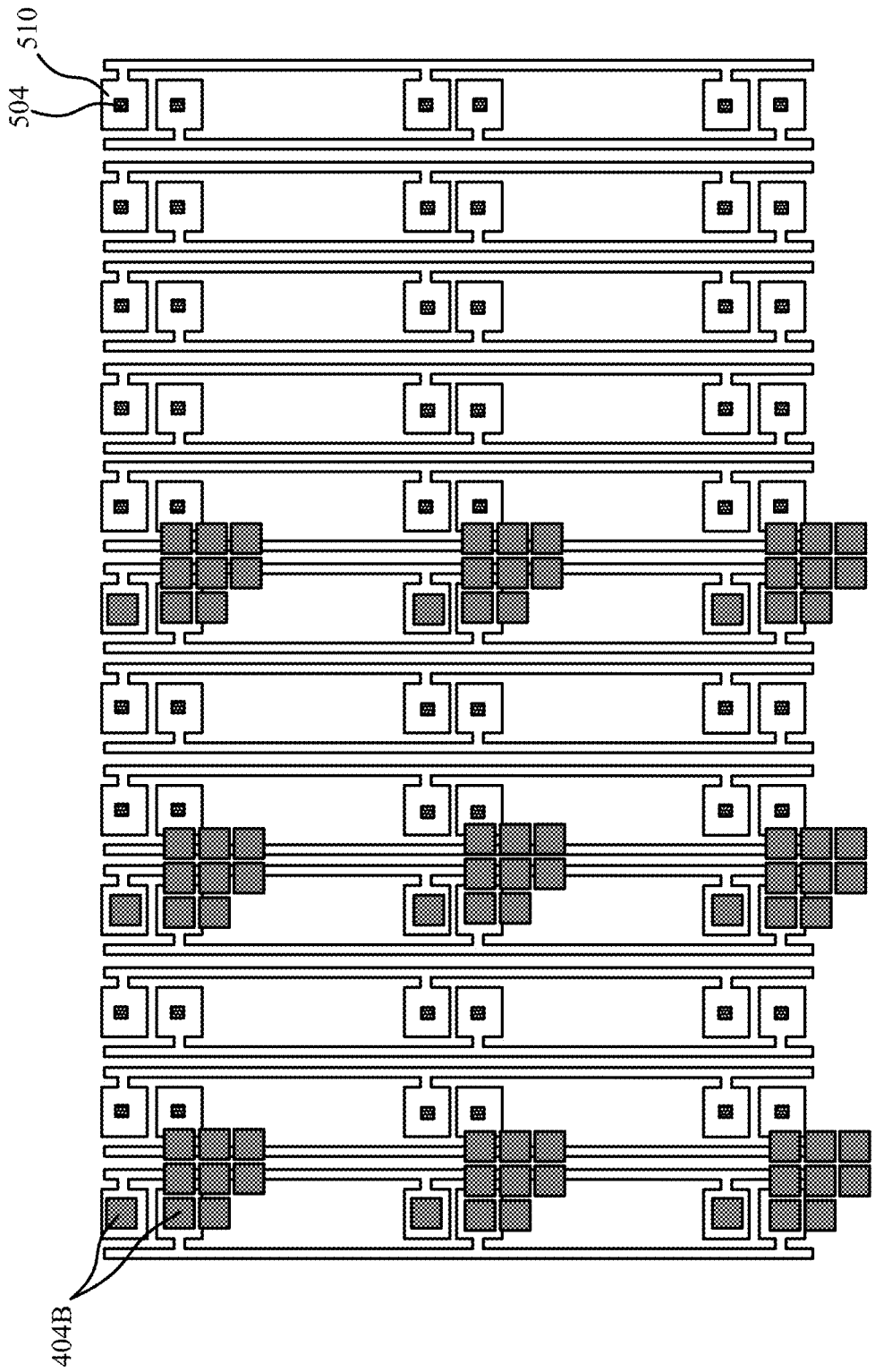
Figure 16:
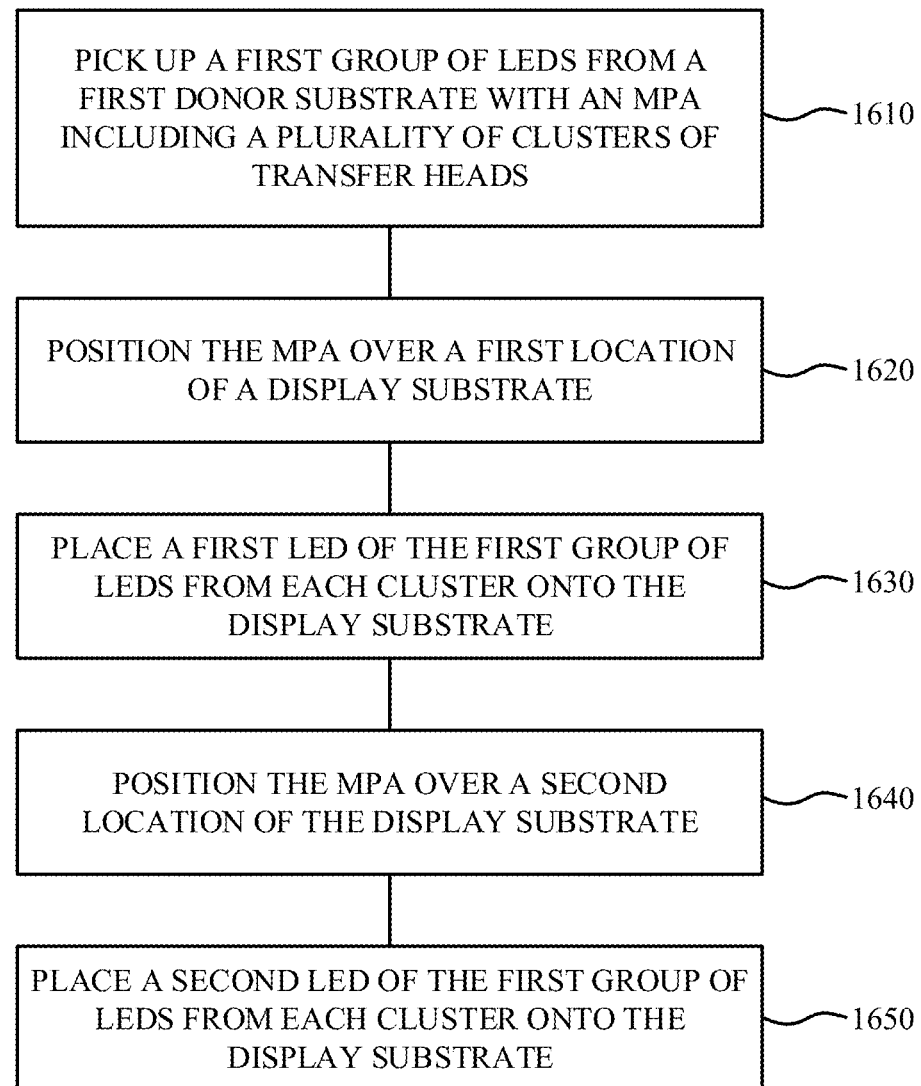
FIG. 16 is a process flow for a sequence of transferring a group of LEDs with a micro pick up array comprising a plurality of clusters of transfer heads in accordance with an embodiment.

Referring to FIG. 15B the articulating transfer head assembly and MPA 103 are then positioned over a second location of the display substrate at operation 1640, and a second blue-emitting LED 404B of the first group of LEDs from each cluster 310 is placed onto the display substrate at operation 1650. In the particular embodiment illustrated, the upper left-hand blue-emitting LED 404B is placed onto a landing pad 510, though any remaining LEDs within the top two rows of the clusters can be placed over a corresponding landing pad 510.

Figure 15C:
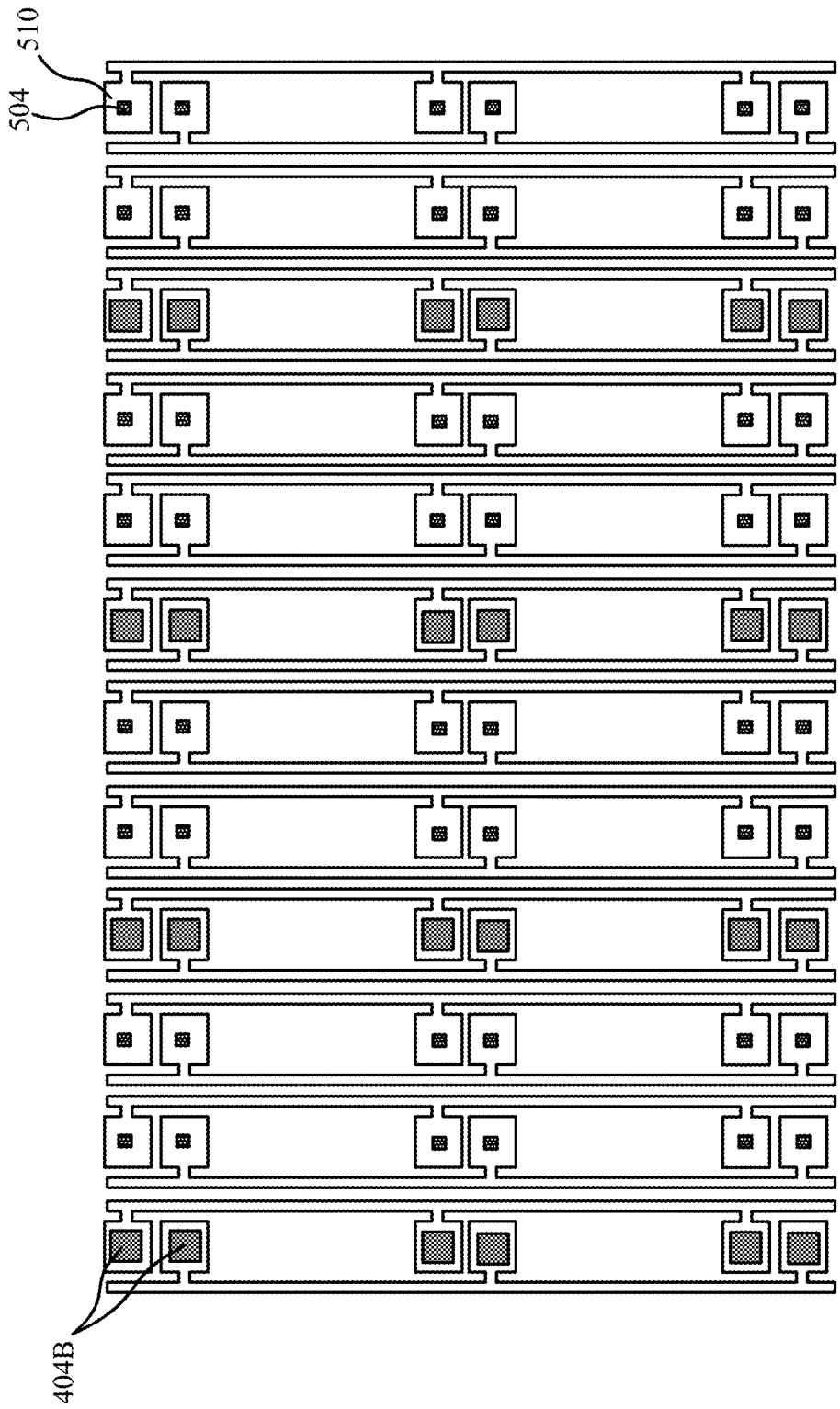

The MPA 103 can then continue to be positioned over a new location of the display substrate, and another blue-emitting LED 404B of the first group of LEDs from each cluster 310 can be placed onto the display substrate until all blue-emitting LEDs 404B of the first group of LEDs held by the MPA 103 have been placed onto the display substrate. FIG. 15C is an exemplary illustration of a display substrate populated with blue-emitting LEDs 404B of the first group of LEDs. While the process sequence begins with blue-emitting LEDs 404B, this is also merely an illustrative example and embodiments are not so required.

Figure 15D:
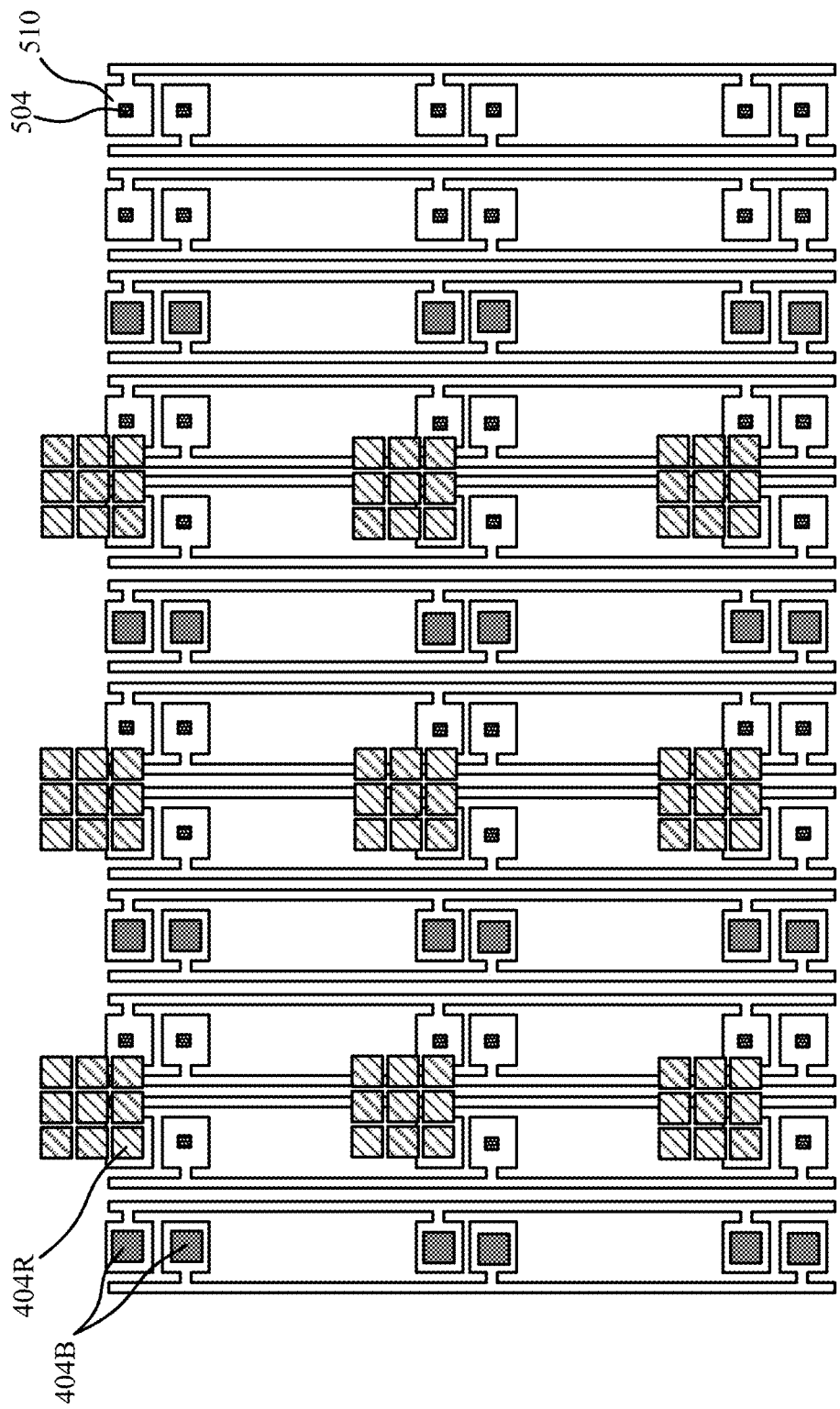
FIGS. 15D-15F are plan view illustrations of a single pick and multiple place sequence for a plurality of second color-emitting LEDs in accordance with an embodiment.
Figure 15E:
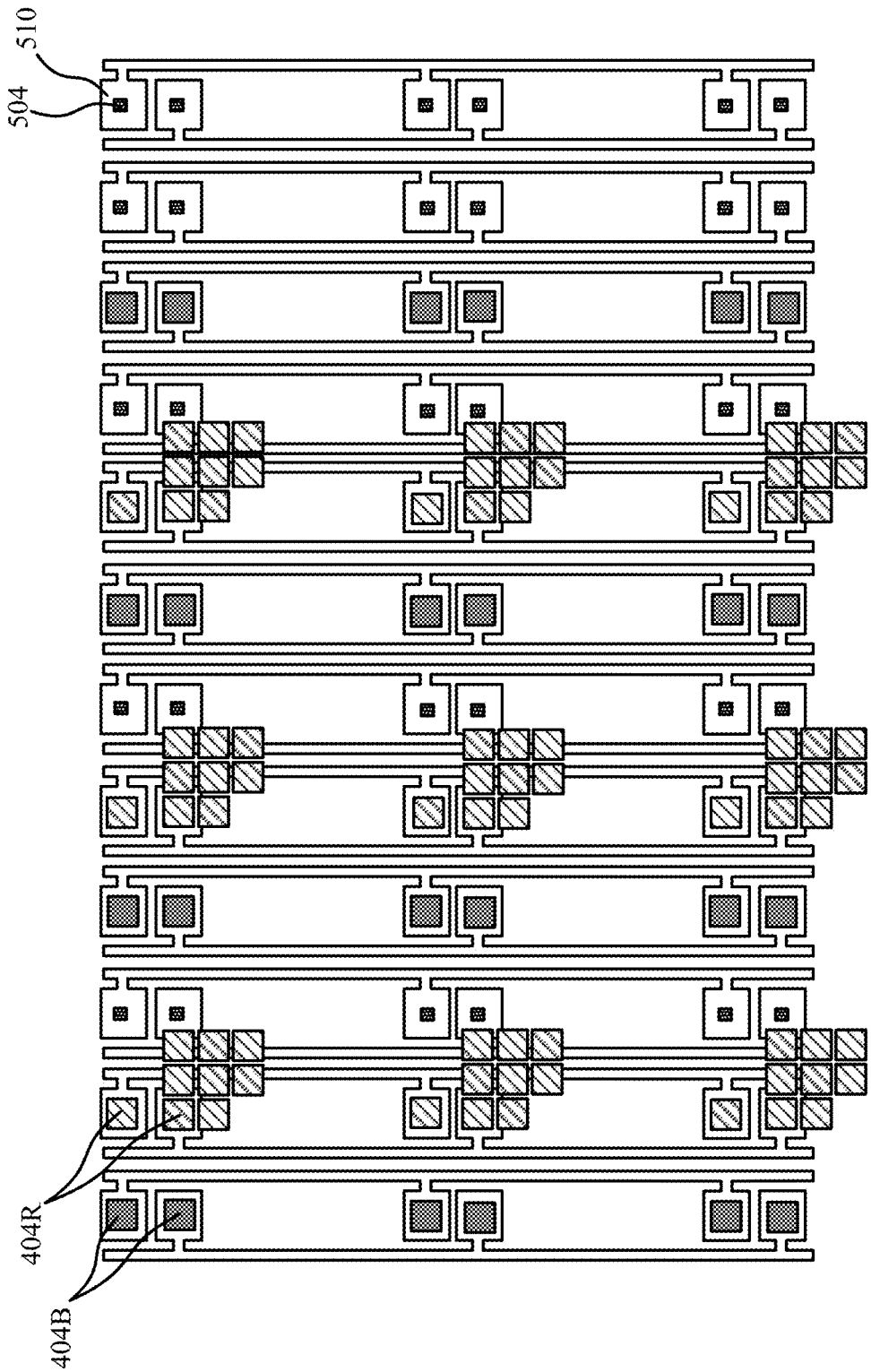
Figure 15F:
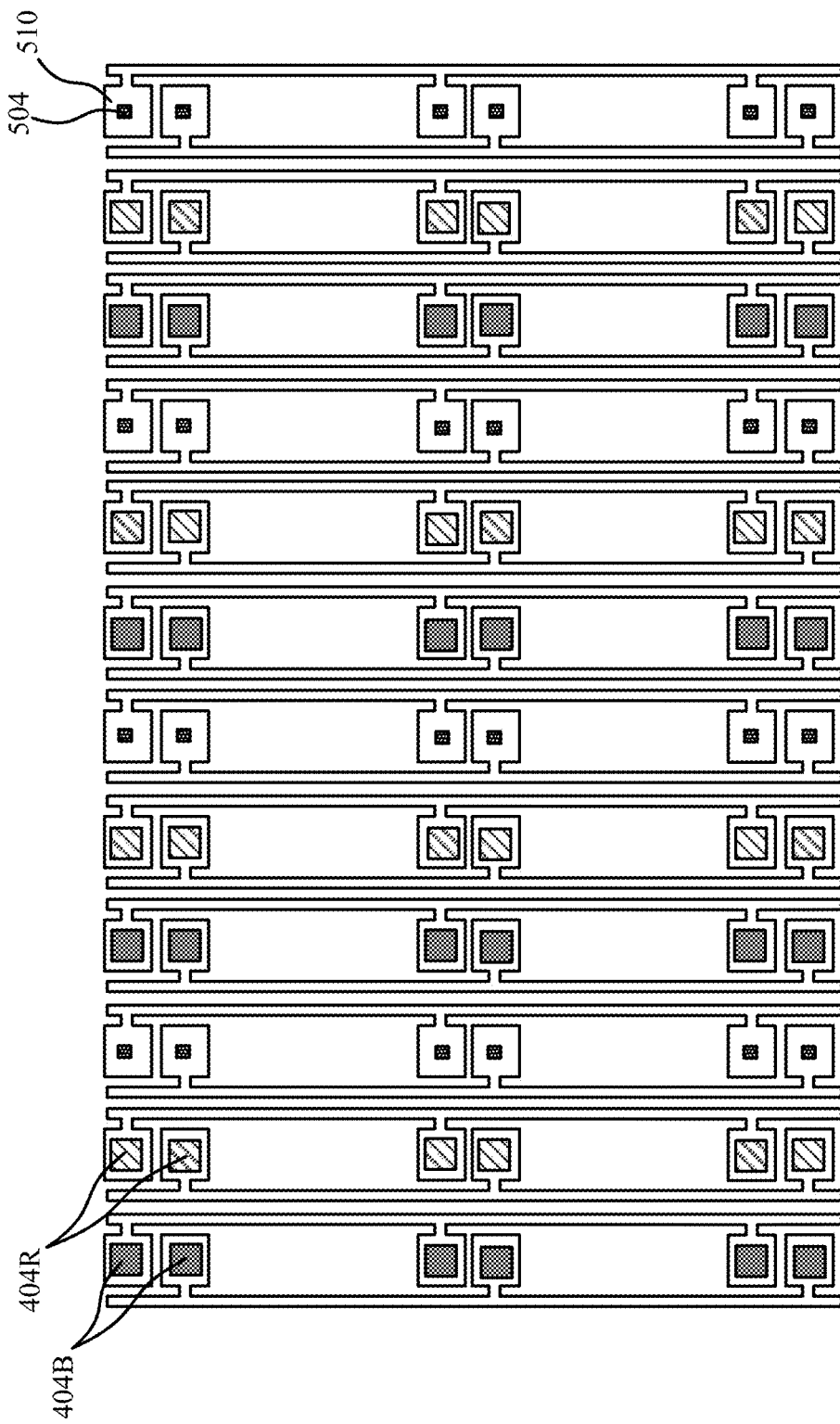
Figure 15G:
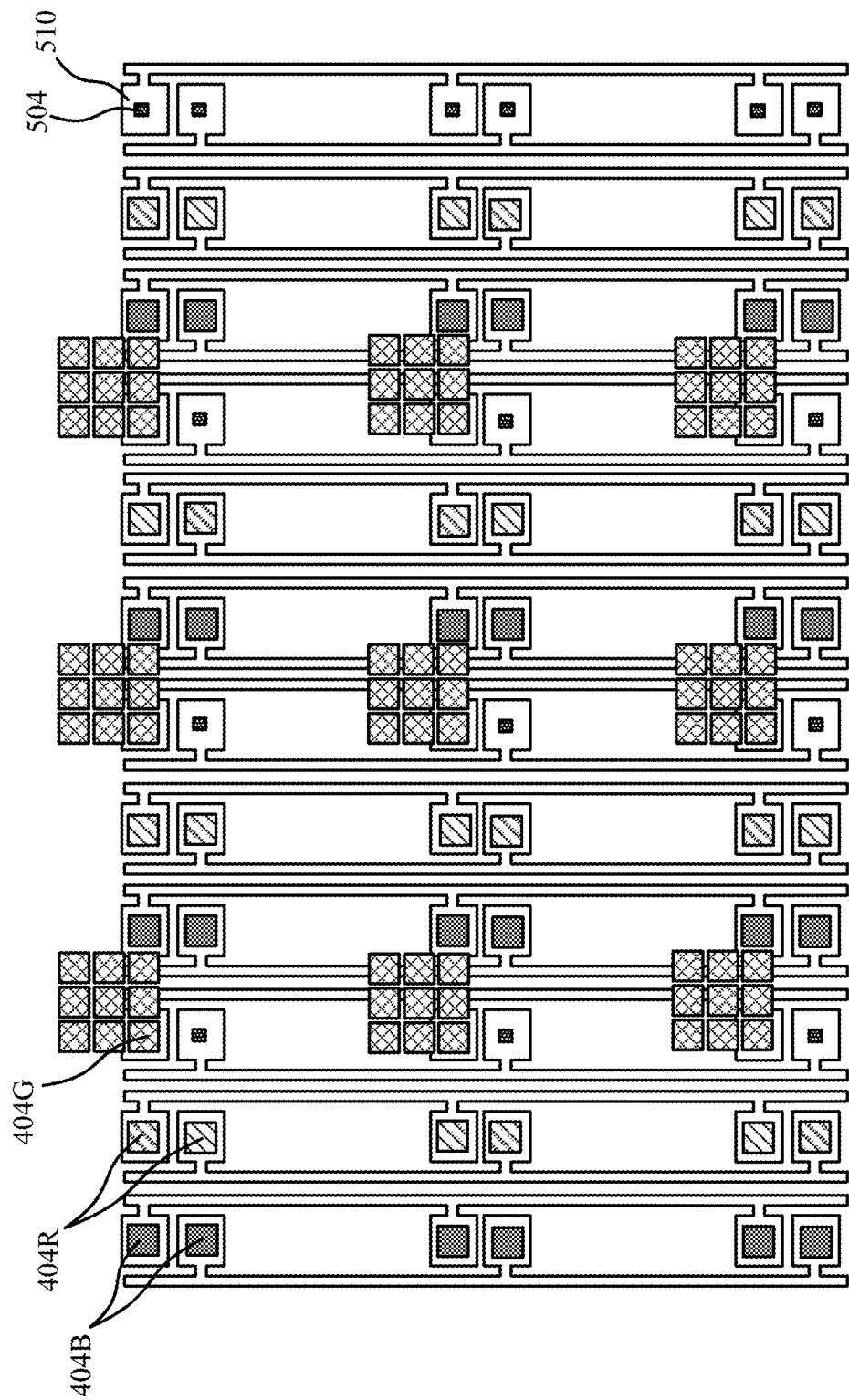
FIGS. 15G-15I are plan view illustrations of a single pick and multiple place sequence for a plurality of third color-emitting LEDs in accordance with an embodiment.
Figure 15H:
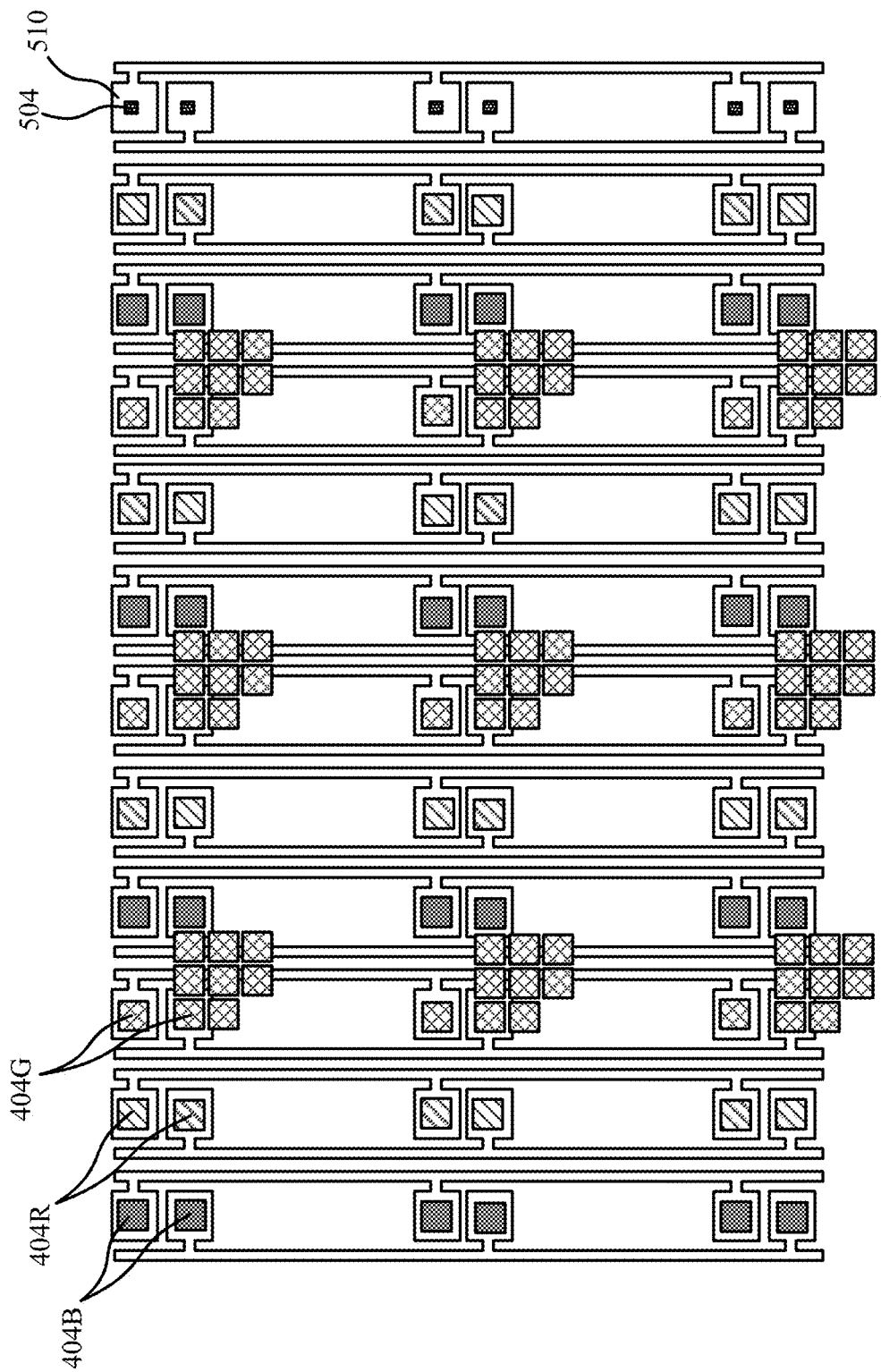
Figure 15I:
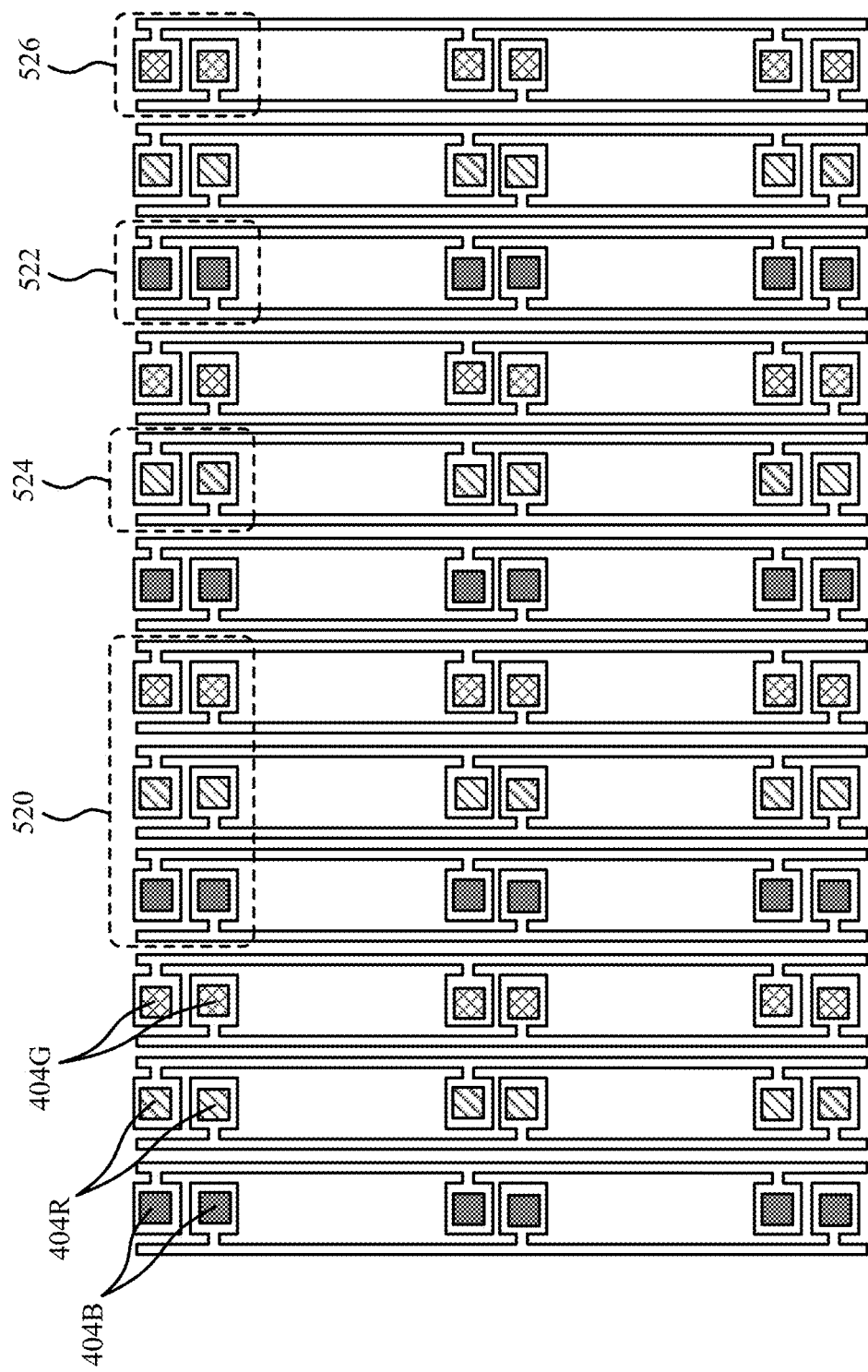

The MPA 103 can then be translated to a second donor substrate, followed by picking up a second group of LEDs (e.g. red-emitting LEDs 404R) from the second donor substrate with the MPA 103 comprising the plurality of clusters 310 of transfer heads 115. Referring to FIG. 15D, the MPA 103 can then be positioned over a third location of the display substrate, followed by placement of a first red-emitting LED 404R from the second group of LEDs from each cluster 310 onto the display substrate. Referring to FIG. 15E, the MPA 103 is then positioned over a fourth location of the display substrate followed by placement of a second red-emitting LED 404R of the second group of LEDs from each cluster 310 onto the display substrate. The MPA 103 can then continue to be positioned over a new location of the display substrate, and another red-emitting LED 404R of the second group of LEDs from each cluster 310 can be placed onto the display substrate until all red-emitting LEDs 404R of the second group of LEDs held by the MPA 103 have been placed onto the display substrate. FIG. 15F is an exemplary illustration of a display substrate populated with blue-emitting LEDs 404B of the first group of LEDs and red-emitting LEDs 404R of the second group of LEDs. Referring to FIGS. 15G-15I, the process sequence can then be repeated again to cluster pick and sequential place a through group of LEDs, such as green-emitting LEDs 404G onto the display substrate.

Referring briefly back to FIG. 1, the cluster pick and sequential placement sequences can be performed with multiple articulating transfer head assemblies 200 and corresponding MPAs 103 in order to further increase assembly throughput. For example, each articulating transfer head assembly 200 and corresponding MPA 103 can pick up a corresponding group of LEDs from the same donor substrate, then both be translated toward the display substrate, followed by sequential placement of the first group of LEDs held by the first MPA 103 onto the display substrate, then sequential placement of the second group of LEDs held by the second MPA 103 onto the display substrate.

Figure 17:
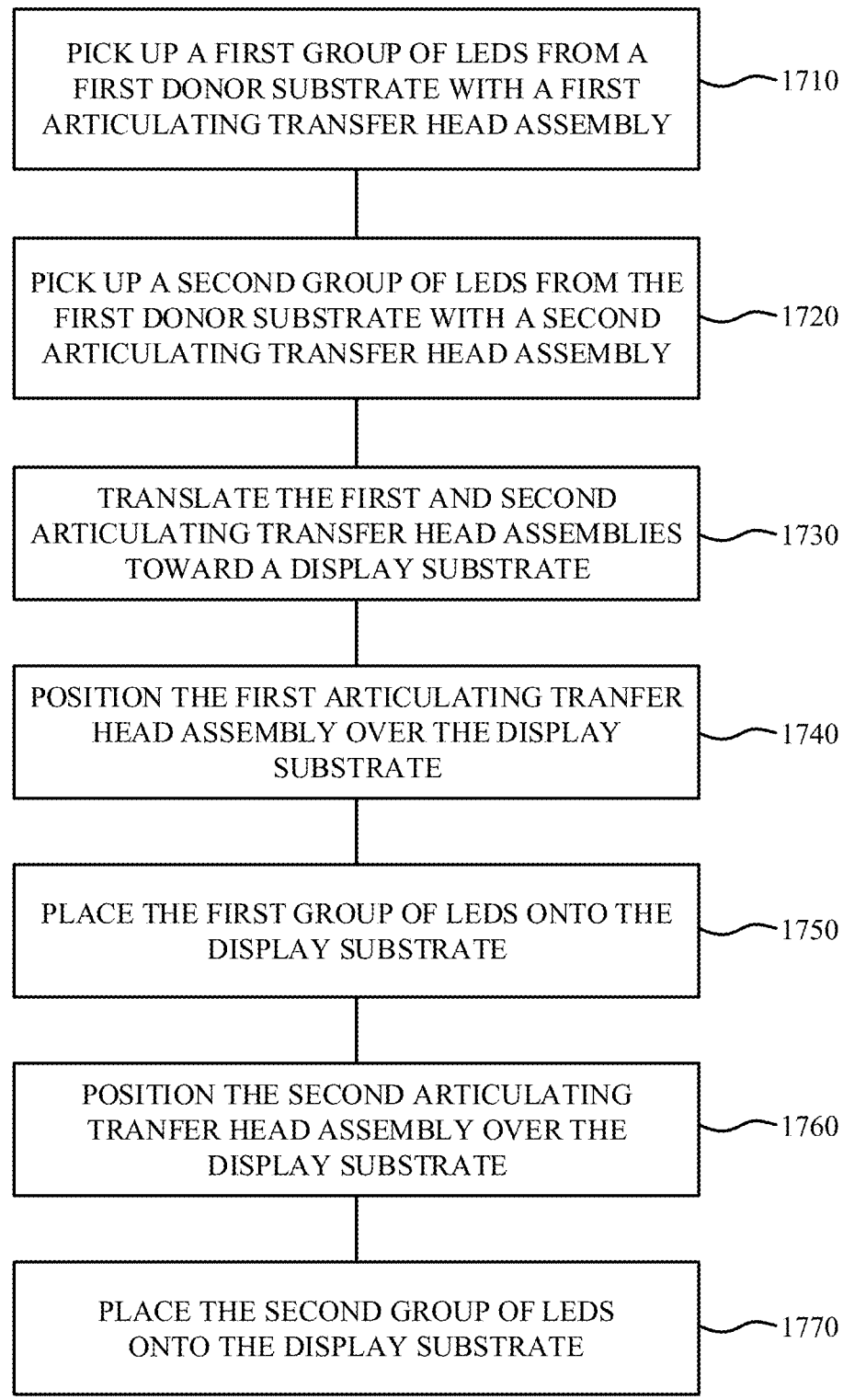
FIG. 17 is a process flow for a sequence of transferring multiple groups of LEDs with multiple articulating transfer head assemblies in accordance with an embodiment.

FIG. 17 is a process flow for a sequence of transferring multiple groups of LEDs with multiple articulating transfer head assemblies 200 in accordance with an embodiment. At operation 1710 a first group of LEDs is picked up from a first donor substrate with a first articulating transfer head assembly, followed by picking up a second group of LEDs from the same donor substrate with a second articulating transfer head assembly at operation 1720. For example, this may include picking up the first group of LEDs with a first MPA 103 including a first plurality of clusters 310 of transfer heads 115, and picking up the second group of LEDs with a second MPA 103 including a second plurality of clusters 310 of transfer heads 115. The first and second articulating transfer head assemblies are then translated (e.g. along translation track 110) toward a display substrate at operation 1730. This may include translating both the first and second articulating transfer head assemblies over an inspection camera 120.

At operation 1740 the first articulating transfer head assembly, and corresponding MPA 103, is positioned over the display substrate, followed by placing the first group LEDs onto the display substrate at operation 1750. For example, this may be a sequential placement sequence as illustrated in FIGS. 15A-15C, for example. At operation 1760 the second articulating transfer head assembly, and corresponding MPA 103, is positioned over the display substrate, followed by placing the second group of LEDs onto the display substrate at operation 1770. For example, this may also be a sequential placement sequence as illustrated in FIGS. 15D-15F or FIGS. 15G-15I, for example. The multiple articulating transfer head assembly transfer sequence can also be performed without the cluster pick and sequential placement operations.

In utilizing the various aspects of the embodiments, it would become apparent to one skilled in the art that combinations or variations of the above embodiments are possible for transferring an array of micro devices. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration. In particular, while the above embodiments have been specifically described with regard to LEDs, and more particularly to micro LEDs, the MTT 100 and sequences can also be applied to other applications to increase throughput for the population of devices, and specifically micro devices. Accordingly, the above descriptions and illustrations of LEDs and display substrates are generically applicable to other micro device applications and receiving substrates that can be populated using the MTT 100 and transfer sequences described.

What is claimed is:

1. A micro pick up array comprising:
   a base substrate; and
   an array of polysilicon compliant transfer heads on the base substrate, wherein each polysilicon compliant transfer head includes:
   a plurality of polysilicon vertical interconnects connected to a polysilicon upper spring layer, wherein the polysilicon upper spring layer includes a polysilicon spring platform; and
   a polysilicon mesa structure protruding from the spring platform.

2. The micro pick up array of claim 1, wherein each polysilicon compliant transfer head includes a plurality of polysilicon anchor plugs protruding from the base substrate and connected to a polysilicon base spring layer.

3. The micro pick up array of claim 2, wherein each polysilicon anchor plug is connected to a corresponding base spring of the polysilicon base spring layer.

4. The micro pick up array of claim 2, wherein the plurality of polysilicon vertical interconnects protrudes from the polysilicon base spring layer.

5. The micro pick up array of claim 4, wherein the polysilicon upper spring layer includes a plurality of upper spring arms that connect the plurality of polysilicon vertical interconnects to the spring platform.

6. The micro pick up array of claim 1, further comprising a voltage source contact connected to the an array of polysilicon compliant transfer heads.

7. The micro pick up array of claim 6, wherein the voltage source contact is connected to the base substrate to transfer a voltage potential through the base substrate to the array of polysilicon compliant transfer heads.

8. The micro pick up array of claim 1, wherein the array of polysilicon compliant transfer heads is arranged in a plurality of clusters, each cluster comprising a corresponding plurality of polysilicon compliant transfer heads.

9. A micro pick up array comprising:
   a base substrate;
   an array of polysilicon compliant transfer heads on the base substrate;
   an encapsulation membrane layer;
   wherein each polysilicon compliant transfer head includes a spring platform and a mesa structure protruding from the spring platform; and
   wherein each mesa structure protrudes through a corresponding opening in the encapsulation membrane layer and is deflectable toward the base substrate without deflecting the encapsulation membrane layer.

10. The micro pick up array of claim 9, wherein the encapsulation membrane layer comprises polysilicon.

11. The micro pick up array of claim 9, further comprising an upper cavity between the spring platform and the encapsulation membrane layer.

12. The micro pick up array of claim 9, wherein the spring platform is part of a base spring layer, and further comprising a plurality of anchor plugs that connect the base spring layer to a plurality of plugs extending through the base substrate.

13. The micro pick up array of claim 12, wherein the base substrate is coupled to a first voltage source contact, and the plurality of plugs extending through the base substrate are coupled to a second voltage source contact.

14. A micro pick up array comprising:
   a base substrate;
   an array of transfer heads over the base substrate, each transfer head including a mesa structure, and each mesa structure includes a top surface;

a dielectric layer spanning over the mesa structures of the array of transfer heads;

an electrically conductive layer spanning over the base substrate, over the dielectric layer, and over the top surface of each mesa structure for each transfer head in the array of transfer heads;

a first voltage source contact coupled with the electrically conductive layer; and a second voltage source contact coupled with the array of mesa structures of the array of transfer heads.

15. The micro pick up array of claim 14, further comprising an array of apertures in the electrically conductive layer over the top surfaces of the mesa structures of the array of transfer heads.

16. The micro pick up array of claim 14, further comprising an insulating layer on the base substrate, and an opening extending through the insulating layer; wherein the electrically conductive layer spans through the opening to contact the base substrate.

17. The micro pick up array of claim 14, wherein the first voltage source contact is electrically connected to the base substrate.

18. The micro pick up array of claim 17, wherein the first voltage source is connected to ground.

19. The micro pick up array of claim 17, wherein the second voltage source contact includes a plug that extends through the base substrate, wherein the plug is electrically isolated from the base substrate.

20. The micro pick up array of claim 14, wherein the array of transfer heads is arranged in a plurality of clusters, each cluster comprising a corresponding plurality of transfer heads.

21. A micro pick up array comprising:
a base substrate;
a base spring layer over the base substrate, the base spring layer including a plurality of base spring arms and a spring platform;
a mesa structure protruding from the spring platform; and
an encapsulation membrane layer spanning over the base spring layer, wherein the mesa structure protrudes through a corresponding opening in the encapsulation membrane layer and is deflectable through the corresponding opening and toward the base substrate.

22. The micro pick up array of claim 21, further comprising a second mesa structure protruding from the spring platform and through a second corresponding opening the encapsulation membrane layer.

23. The micro pick up array of claim 21, wherein the base substrate is coupled to a first voltage source contact, and the base spring layer is coupled to a second voltage source contact.

24. The micro pick up array of claim 23, further comprising a plurality of plugs that extend through the base substrate to electrically connect the base spring layer and the second voltage source contact.

25. A micro pick up array comprising:
a cluster of a plurality of transfer heads arranged in a plurality of rows of transfer heads;
wherein each transfer head is an electrostatic transfer head that includes a first mesa structure and a second mesa structure; and
a plurality of submesa interconnects, wherein each row of transfer heads spans over a pair of submesa interconnects, with each first mesa structure protrudes from a first submesa interconnect and each second mesa structure protrudes from a second submesa interconnect.

26. The micro pick up array of claim 25, wherein the plurality of submesa interconnects includes a first plurality of first submesa interconnects coupled to a same first voltage source, and a second plurality of second submesa interconnects coupled with a same second voltage source.

27. The micro pick up array of claim 25, wherein the first mesa structures for a first row of transfer heads and the first mesa structures for a second row of transfer heads both protrude from a same first submesa interconnect.

28. The micro pick up array of claim 27, wherein the second mesa structures for the second row of transfer heads and second mesa structures for a third row of transfer heads protrude from a same second submesa interconnect.

* * * * *